US012765160B2

(12) United States Patent
Yoo et al.

(10) Patent No.: US 12,765,160 B2
(45) Date of Patent: Oct. 13, 2026

(54) MIXED SOLVENT FOR QUANTUM DOT INK COMPOSITION, QUANTUM DOT INK COMPOSITION INCLUDING THE SAME, LIGHT-EMITTING DEVICE MANUFACTURED USING QUANTUM DOT INK COMPOSITION, AND ELECTRONIC APPARATUS INCLUDING THE LIGHT-EMITTING DEVICE

(71) Applicant: Samsung Display Co., Ltd., Yongin-si (KR)

(72) Inventors: Dongsun Yoo, Yongin-si (KR); Gyubong Kim, Yongin-si (KR); Sanghee Yu, Yongin-si (KR); Sehun Kim, Yongin-si (KR); Jihye Kim, Yongin-si (KR); Hoilim Kim, Yongin-si (KR); Yohan Suh, Yongin-si (KR); Yunku Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 740 days.

(21) Appl. No.: 18/299,825

(22) Filed: Apr. 13, 2023

(65) Prior Publication Data

US 2024/0099044 A1 Mar. 21, 2024

(30) Foreign Application Priority Data

Aug. 25, 2022 (KR) ........................ 10-2022-0107150

(51) Int. Cl.

| | |
|---|---|
| ***H10K 50/115*** | (2023.01) |
| ***C09D 5/22*** | (2006.01) |
| ***C09K 11/08*** | (2006.01) |
| ***C09K 11/70*** | (2006.01) |

(52) U.S. Cl.

CPC ............ *H10K 50/115* (2023.02); *C09D 5/22* (2013.01); *C09K 11/0811* (2013.01); *C09K 11/70* (2013.01)

(58) Field of Classification Search

CPC .................................................... H10K 50/115

See application file for complete search history.

(56) References Cited

U.S. PATENT DOCUMENTS

2006/0157686 A1 7/2006 Jang et al.

FOREIGN PATENT DOCUMENTS

| | | | | |
|---|---|---|---|---|
| CN | 105820662 A | * 8/2016 | | C09D 11/38 |
| CN | 106189515 A | * 12/2016 | | C09D 11/36 |
| CN | 108659616 A | * 10/2018 | | C09D 11/36 |
| JP | 2019-119893 | 7/2019 | | |
| KR | 10-2006-0084668 | 7/2006 | | |
| KR | 10-1714342 | 3/2017 | | |
| KR | 10-2028969 | 10/2019 | | |

OTHER PUBLICATIONS

Clarivate Analytics machine translation of Cn 105820662 A to Li. published Aug. 3, 2016 (Year: 2016).*

Clarivate Analytics machine translation of CN 106189515 A to Li, published Dec. 7, 2016 (Year: 2016).*

Clarivate Analytics machine translation of CN 108659616 A to Li, published Oct. 16, 2018 (Year: 2018).*

Takaaki Tomai et al., "Solvent accommodation effect on dispersibility of metal oxide nanoparticle with chemisorbed organic shell", J. Colloid Interface Sci. 587 (2021) 574-580.

* cited by examiner

*Primary Examiner* — Jane L Stanley

(74) *Attorney, Agent, or Firm* — CANTOR COLBURN LLP

(57) ABSTRACT

Embodiments provide a mixed solvent for a quantum dot ink composition, wherein the mixed solvent includes at least two solvents, an $R_1$ value of the mixed solvent is greater than or equal to about 7.3 $Mpa^{0.5}$, an $R_2$ value of the mixed solvent is greater than or equal to about 5.0 $Mpa^{0.5}$, and a molar volume of the mixed solvent is greater than or equal to about 160 $cm^3/mol$.

19 Claims, 3 Drawing Sheets

MIXED SOLVENT FOR QUANTUM DOT INK COMPOSITION, QUANTUM DOT INK COMPOSITION INCLUDING THE SAME, LIGHT-EMITTING DEVICE MANUFACTURED USING QUANTUM DOT INK COMPOSITION, AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2022-0107150 under 35 U.S.C. § 119, filed on Aug. 25, 2022, in the Korean Intellectual Property Office, the entire contents of which are incorporated herein by reference.

BACKGROUND

1. Technical Field

Embodiments relate to a mixed solvent for a quantum dot ink composition, a quantum dot ink composition including the same, a light-emitting device manufactured using the quantum dot ink composition, and an electronic apparatus including the light-emitting device.

2. Description of the Related Art

Quantum dots are nanocrystals of semiconductor materials and exhibit a quantum confinement effect. When the quantum dots receive light from an excitation source and reach an energy excited state, they emit energy by themselves according to a corresponding energy band gap. In this regard, even in the same material, the wavelength varies according to the particle size, and accordingly, by adjusting the size of quantum dots, light of a desired wavelength range may be obtained, and excellent color purity and high luminescence efficiency may be obtained. Thus, quantum dots are applicable to various devices.

By adjusting the particle size of quantum dots, the quantum dots may realize various colors and have excellent luminescence characteristics due to the quantum confinement effect.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may include a mixed solvent for a quantum dot ink composition, which reduces damage to inkjet equipment and improves quantum dot aggregation defects, and a quantum dot ink composition including the same.

Additional aspects will be set forth in part in the description which follows and, in part, will be apparent from the description, or may be learned by practice of the embodiments of the disclosure.

According to embodiments, a mixed solvent for a quantum dot ink composition may include:

at least two solvents, wherein an $R_1$ value of the mixed solvent may be greater than or equal to about 7.3 $Mpa^{0.5}$, an $R_2$ value of the mixed solvent may be greater than or equal to about 5.0 $Mpa^{0.5}$, a molar volume of the mixed solvent may be greater than or equal to about 160 $cm^3$/mol, $$R_1^2 = 4(dD - 19.7)^2 + (dP - 8.4)^2 + (dH - 9.0)^2,$$

$$R_2^2 = 4(dD - 17.2)^2 + dP^2 + (dH - 1.5)^2,$$

dD indicates a dispersion component of Hansen parameters for each of the at least two solvents, dP indicates a polar component of the Hansen parameters for each of the at least two solvents, dH indicates a hydrogen-bonding component of the Hansen parameters for each of the at least two solvents, the $R_1$ value and the $R_2$ value of the mixed solvent may each be calculated by adding values obtained by multiplying dD, dP, and dH of each of the at least two solvents respectively by wt % ratio of the at least two solvents, and the molar volume of the mixed solvent may be calculated by adding values obtained by multiplying a molar volume of each of the at least two solvents respectively by the wt % ratio of the at least two solvents.

According to embodiments, the mixed solvent may include a solvent Z, an $R_3$ value of the solvent Z may be less than or equal to about 6.8 $Mpa^{0.5}$, a molar volume of the solvent Z may be less than or equal to about 160 $cm^3$/mol, $$R_3^2 = 4(dD - 15.5)^2 + (dP - 1.5)^2 + (dH - 2.3)^2,$$

dD indicates a dispersion component of Hansen parameters for the solvent Z, dP indicates a polar component of the Hansen parameters for the solvent Z, and dH indicates a hydrogen-bonding component of the Hansen parameters for the solvent Z.

According to embodiments, an amount of the solvent Z may be greater than 0 wt % and less than or equal to about 9 wt %, based on 100 wt % of the mixed solvent.

According to embodiments, the mixed solvent may include a first solvent and a second solvent, an amount of the first solvent may be greater than or equal to about 95 wt % and less than 100 wt %, based on 100 wt % of the mixed solvent, and an amount of the second solvent may be greater than 0 wt % and less than or equal to about 5 wt %, based on 100 wt % of the mixed solvent.

According to embodiments, the first solvent may include an alcohol moiety, an ether moiety, or an ester moiety.

According to embodiments, the second solvent may include a linear or branched $C_1$-$C_{10}$ saturated hydrocarbon moiety, an ether moiety, an ester moiety, a halogen moiety, or a ketone moiety.

According to embodiments, the mixed solvent may include 1-methoxy-2-[2-[2-[2-(2-methoxyethoxy)ethoxy]ethoxy]ethoxy]ethane, 1,3-bis[(2-methylpropan-2-yl)oxy]propan-2-ol, 2-butyldecan-1-ol, 2-[2-[2-(2-butoxyethoxy)ethoxy]ethoxy]ethanol, dipropyl a benzene-1,2,- dicarboxylate, 2-ethoxy-2-methylbutane, 2-propan-2-yloxypropane, 1,1,1,3,3-pentafluorobutane, tert-butyl acetate, or 2,4-dimethylpentan-3-one.

According to embodiments, the mixed solvent may not include:

a solvent which may have an $R_1$ value of less than or equal to about 7.3 $Mpa^{0.5}$ and a molar volume of less than or equal to about 160 $cm^3$/mol; or a solvent which may have an $R_2$ value of less than or equal to about 5.0 $Mpa^{0.5}$ and a molar volume of less than or equal to about 160 $cm^3$/mol.

According to embodiments, a quantum dot ink composition may include a quantum dot, and the mixed solvent for the quantum dot ink composition.

According to embodiments, the quantum dot may have a core-shell structure, and the quantum dot may include:

a core including a semiconductor compound; and a shell including a metal oxide, a metalloid oxide, a non-metal oxide, a semiconductor compound, or any combination thereof.

According to embodiments, the semiconductor compound may include a Group II-VI semiconductor compound, a Group III-V semiconductor compound, a Group III-VI semiconductor compound, a Group semiconductor compound, a Group IV-VI semiconductor compound, a Group IV element or compound, or a combination thereof, and the metal oxide, the metalloid oxide, or the non-metal oxide may include $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, $MgAl_2O_4$, $CoFe_2O_4$, $NiFe_2O_4$, $CoMn_2O_4$, or any combination thereof.

According to embodiments, the semiconductor compound may include CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, InGaZnP, InAlZnP, GaS, GaSe, $Ga_2Se_3$, GaTe, InS, InSe, $In_2S_3$, $In_2Se_3$, InTe, $InGaS_3$, $InGaSe_3$, AgInS, $AgInS_2$, CuInS, $CuInS_2$, $CuGaO_2$, $AgGaO_2$, $AgAlO_2$, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, Si, Ge, SiC, SiGe, or any combination thereof.

According to embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

According to embodiments, a viscosity (at 25° C.) of the composition may be in a range of about 2 cP to about 10 cP.

According to embodiments, a surface tension of the composition may be in a range of about 20 dyne/cm to about 40 dyne/cm.

According to embodiments, a vapor pressure of the composition may be less than or equal to about $10^{-2}$ mmHg.

According to embodiments, a light-emitting device may include a first electrode, a second electrode facing the first electrode, and an interlayer between the first electrode and the second electrode and including an emission layer, wherein the emission layer may be prepared using the quantum dot ink composition.

According to embodiments, the interlayer may further include a hole transport region including:

a hole injection layer, a hole transport layer, an emission auxiliary layer, an electron blocking layer, or any combination thereof.

According to embodiments, the interlayer may further include an electron transport region including:

a hole blocking layer, an electron transport layer, an electron injection layer, or any combination thereof.

According to embodiments, an electronic apparatus may include the light-emitting device.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
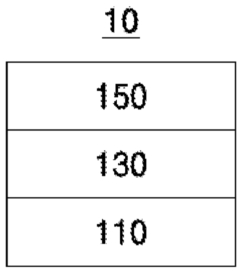
FIG. 1 is a schematic view of a structure of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that the terms "connected to" or "coupled to" may refer to a physical, electrical and/or fluid connection or coupling, with or without intervening elements.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Quantum dot light-emitting devices may be devices including quantum dots, which are nano-sized inorganic crystals, in an emission layer. Quantum dots may emit light of a desired wavelength by controlling the size of the quantum dots, and have excellent color reproducibility and high luminance due to a narrow half-width of an emission waveform. Thus, quantum dot light-emitting devices become popular as next-generation light-emitting devices.

Quantum dots may be generally dispersed in a dispersion solvent to form a thin film by a solution process. Quantum dot dispersions are required to evenly disperse quantum dots as well as having appropriate viscosity, surface tension, and boiling point so as to be used in an inkjet process.

When swelling in which a volume increases occurs because a polymer component of inkjet equipment holds a solvent therein, or a phenomenon in which an adhesive component is dissolved in a solvent or the like occurs, an inkjet process may be impossible, and thus, a solvent compatible with inkjet equipment should be used.

In an inkjet process, due to penetration of a solvent of a quantum dot dispersion into a head component of inkjet equipment, the equipment may be damaged, process precision may be deteriorated, and periodic replacement of parts may be required.

When a dispersion force of a solvent is not sufficient, aggregation defects in which quantum dots are aggregated may occur.

According to embodiments, a mixed solvent for a quantum dot ink composition may include at least two solvents, wherein an $R_1$ value of the mixed solvent may be greater than or equal to about 7.3 $Mpa^{0.5}$, an $R_2$ value of the mixed solvent may be greater than or equal to about 5.0 $Mpa^{0.5}$, and a molar volume of the mixed solvent may be greater than or equal to about 160 $cm^3$/mol.

The $R_1$ value and the $R_2$ value may be obtained by the following Equations.

$$R_1^2 = 4(dD - 19.7)^2 + (dP - 8.4)^2 + (dH - 9.0)^2,$$

$$R_2^2 = 4(dD - 17.2)^2 + dP^2 + (dH - 1.5)^2,$$

dD indicates a dispersion component of Hansen parameters for each of the at least two solvents, dP indicates a polar component of the Hansen parameters for each of the at least two solvents, dH indicates a hydrogen-bonding component of the Hansen parameters for each of the at least two solvents, the $R_1$ value and the $R_2$ value of the mixed solvent may each be calculated by adding values obtained by multiplying dD, dP, and dH of each of the at least two solvents respectively by a wt % ratio of the at least two solvents, and the molar volume of the mixed solvent may be calculated by adding values obtained by multiplying a molar volume of each of the at least two solvents respectively by the wt % ratio of the at least two solvents.

For example, when the mixed solvent includes 60 wt % of a first solvent, 30 wt % of a second solvent, and 10 wt % of a third solvent, in calculation of the $R_1$ value, dD=dD of the first solvent×0.6+dD of the second solvent×0.3+dD of the third solvent×0.1.

Likewise, in calculation of the $R_1$ value, dP=dP of the first solvent×0.6+dP of the second solvent×0.3+dP of the third solvent×0.1.

Likewise, in calculation of the $R_1$ value, dH=dH of the first solvent×0.6+dH of the second solvent×0.3+dH of the third solvent×0.1.

The molar volume may be equal to a molar volume of the first solvent×0.6+a molar volume of the second solvent×0.3+a molar volume of the third solvent×0.1.

R representing Hansen solubility parameters consists of a dispersion component (dD), a polar component (dP), and a hydrogen-bonding component (dH), and may be used to determine solubility or a degree of swelling using a phenomenon in which similar solvents are well mixed. These parameters may be calculated with a HSPiP program.

A difference between Hansen solubility parameters of two materials a and b may be calculated as follows.

$$R^2 = 4(dD_a - dD_b)^2 + (dP_a - dP_b)^2 + (dH_a - dH_b)^2,$$

$dD_a$ indicates a dispersion component of the material a, and $dD_b$ indicates a dispersion component of the material b.

$dP_a$ indicates a polar component of the material a, and $dP_b$ indicates a polar component of the material b.

$dH_a$ indicates a hydrogen-bonding component of the material a, and $dH_b$ indicates a hydrogen-bonding component of the material b.

When R is small, the two materials may be similar, and thus, solubility or swelling may be large.

When R of a solvent and a particle (for example, a quantum dot) is small, osmotic repulsion increases, and thus, dispersion may be excellent and aggregation defects may be improved.

When a molar volume of a solvent may be small, penetration increases, resulting in an increase in solubility or swelling and an increase in osmotic repulsion between dispersed particles.

The $R_1$ value and the $R_2$ value may be R values for components commonly used in inkjet equipment parts, and when the $R_1$ value and the $R_2$ value of the mixed solvent are within the above-described range, swelling of the equipment parts may be improved. When a molar volume of a solvent is small, penetration increases, and thus, swelling may increase. The molar volume of the mixed solvent according to an embodiment is within the above-described range, swelling of the equipment parts (for example, an inkjet head part) may be improved.

In an embodiment, the mixed solvent for the quantum dot ink composition may include a solvent Z, wherein an $R_3$ value of the solvent Z may be less than or equal to about 6.8 $Mpa^{0.5}$, and a molar volume of the solvent Z may be less than or equal to about 160 $cm^3$/mol.

The $R_3$ value may be obtained by the following Equation.

$$R_3^2 = 4(dD - 15.5)^2 + (dP - 1.5)^2 + (dH - 2.3)^2$$

dD indicates a dispersion component of Hansen parameters for the solvent Z, dP indicates a polar component of the Hansen parameters for the solvent Z, and dH indicates a hydrogen-bonding component of the Hansen parameters for the solvent Z.

The $R_3$ value may be an R value for quantum dots, and when the mixed solvent for the quantum dot ink composition includes the solvent Z having the $R_3$ value and the molar volume within the above-described ranges, dispersion of the quantum dots may be improved.

In an embodiment, an amount of the solvent Z may be greater than 0 wt % and less than or equal to about 9 wt % based on 100 wt % of the mixed solvent.

The solvent Z having a small R with a solute may have a large effective volume fraction even when wt % thereof is small, thereby greatly affecting solubility. Accordingly, even when the solvent Z is included within the above-described range, osmotic repulsion significantly increases, thereby improving dispersion of the quantum dots.

In an embodiment, the mixed solvent may include a first solvent and a second solvent, an amount of the first solvent may be greater than or equal to about 95 wt % and less than 100 wt % based on 100 wt % of the mixed solvent, and an amount of the second solvent may be greater than 0 wt % and less than or equal to about 9 wt % based on 100 wt % of the mixed solvent.

For example, an amount of the second solvent may be greater than 0 wt % and less than or equal to about 5 wt % based on 100 wt % of the mixed solvent. For example, an amount of the second solvent may be greater than about 1 wt % and less than or equal to about 5 wt % based on 100 wt % of the mixed solvent.

For example, the second solvent may be the solvent Z.

For example, the mixed solvent may include the first solvent and the solvent Z, an amount of the first solvent may be greater than about 97 wt % and less than or equal to about 99 wt % based on 100 wt % of the mixed solvent, and an amount of the solvent Z may be greater than about 1 wt % and less than or equal to about 7 wt % based on 100 wt % of the mixed solvent.

The mixed solvent may further include an additive for adjusting viscosity, surface tension, boiling point, or the like without affecting the $R_1$ value, the $R_2$ value, and the molar volume.

In an embodiment, the first solvent may include an alcohol moiety, an ether moiety, or an ester moiety.

In an embodiment, the second solvent may include a linear or branched $C_1$-$C_{10}$ saturated hydrocarbon moiety, an ether moiety, an ester moiety, a halogen moiety, or a ketone moiety.

In an embodiment, the mixed solvent may include 1-methoxy-2-[2-[2-[2-(2-methoxyethoxy)ethoxy]ethoxy]ethoxy]ethane, 1,3-bis[(2-methylpropan-2-yl)oxy]propan-2-ol, 2-butyldecan-1-ol, 2-[2-[2-(2-butoxyethoxy)ethoxy]ethoxy]ethanol, dipropyl a benzene-1,2,-dicarboxylate, 2-ethoxy-2-methylbutane, 2-propan-2-yloxypropane, 1,1,1,3,3-pentafluorobutane, tert-butyl acetate, or 2,4-dimethylpentan-3-one.

In an embodiment, the mixed solvent may not include a solvent having the $R_1$ value of less than or equal to about 7.3 $Mpa^{0.5}$ and the molar volume of less than or equal to about 160 $cm^3$/mol, or a solvent having the $R_2$ value of less than or equal to about 5.0 $Mpa^{0.5}$ and the molar volume of less than or equal to about 160 $cm^3$/mol.

When the mixed solvent includes the solvent having the $R_1$ value of less than or equal to about 7.3 $Mpa^{0.5}$ and the molar volume of less than or equal to about 160 $cm^3$/mol, or the solvent having the $R_2$ value of less than or equal to about 5.0 $Mpa^{0.5}$ and the molar volume of less than or equal to about 160 $cm^3$/mol, swelling of the equipment parts may occur.

A quantum dot ink composition according to embodiments may include a quantum dot and the mixed solvent for the quantum dot ink composition.

The quantum dot ink composition according to an embodiment may have no damage to inkjet equipment by using the mixed solvent and may have excellent dispersion of quantum dots.

In an embodiment, the quantum dot may have a core-shell structure and may include: a core including a semiconductor compound; and a shell including a metal oxide, a metalloid oxide, a non-metal oxide, a semiconductor compound, or any combination thereof.

In an embodiment, the semiconductor compound may include a Group II-VI semiconductor compound, a Group III-V semiconductor compound, a Group III-VI semiconductor compound, a Group I-III-VI semiconductor compound, a Group III-VI semiconductor compound, a Group IV element or compound, or any combination thereof, and the metal oxide, the metalloid oxide, or the non-metal oxide may include $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, $MgAl_2O_4$, $CoFe_2O_4$, $NiFe_2O_4$, $CoMn_2O_4$, or any combination thereof.

According to embodiments, the semiconductor compound may include CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, InGaZnP, InAlZnP, GaS, GaSe, $Ga_2Se_3$, GaTe, InS, InSe, $In_2S_3$, $In_2Se_3$, InTe, $InGaS_3$, $InGaSe_3$, AgInS, $AgInS_2$, CuInS, $CuInS_2$, $CuGaO_2$, $AgGaO_2$, $AgAlO_2$, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, Si, Ge, SiC, SiGe, or any combination thereof.

In an embodiment, the semiconductor compound included in the shell may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may be the same as described below.

In an embodiment, a viscosity (@25° C.) of the composition may be in a range of about 2 cP to about 10 cP.

In an embodiment, a surface tension of the composition may be in a range of about 20 dyne/cm to about 40 dyne/cm.

In an embodiment, a vapor pressure of the composition may be less than or equal to about $10^{-2}$ mmHg.

According to an embodiment, when the viscosity, surface tension, and vapor pressure of the quantum dot ink composition are within the above-described ranges, the quantum dot ink composition may have no difficulty in forming an emission layer by a solution process, such as spin coating or inkjet printing.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

[First Electrode 110]

In FIG. 1, a substrate may be further included under the first electrode 110 or above the second electrode 150. In an embodiment, as the substrate, a glass substrate or a plastic substrate may be utilized. In an embodiment, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material to facilitate injection of holes.

The first electrode 110 may be a reflective electrode, a semi-transmissive electrode, or a transmissive electrode. When the first electrode 110 is a transmissive electrode, the material for forming the first electrode 110 may include indium tin oxide (ITO), indium zinc oxide (IZO), tin oxide ($SnO_2$), zinc oxide (ZnO), or any combination thereof. In an embodiment, when the first electrode 110 is a semi-transmissive electrode or a reflective electrode, the material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure consisting of a single layer, or a multilayer structure. In an embodiment, the first electrode 110 may have a three-layered structure of ITO/Ag/ITO.

[Interlayer 130]

The interlayer 130 may be disposed above the first electrode 110. The interlayer 130 may include an emission layer.

The interlayer 130 may further include a hole transport region located between the first electrode 110 and the emission layer and an electron transport region located between the emission layer and the second electrode 150.

The interlayer 130 may further include a metal-containing compound such as an organometallic compound, an inorganic material such as a quantum dot, or the like, in addition to various organic materials.

In an embodiment, the interlayer 130 may include, two or more emitting units stacked between the first electrode 110 and the second electrode 150, and a charge generation layer located between the two emitting units. When the interlayer 130 includes emitting units and a charge generation layer as described above, the light-emitting device 10 may be a tandem light-emitting device.

[Hole Transport Region in Interlayer 130]

The hole transport region may have: a single-layered structure consisting of a single layer consisting of a single material; a single-layered structure consisting of a single layer consisting of different materials; or a multilayer structure including layers of different materials.

The hole transport region may include a hole injection layer, a hole transport layer, an emission auxiliary layer, an electron blocking layer, or any combination thereof.

In an embodiment, the hole transport region may have a multilayer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure may be stacked in this stated order from the first electrode 110.

The hole transport region may include a compound represented by Formula 201, a compound represented by Formula 202, or any combination thereof:

[Formula 201]

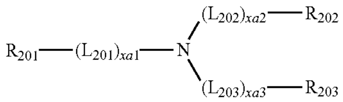

[Formula 202]

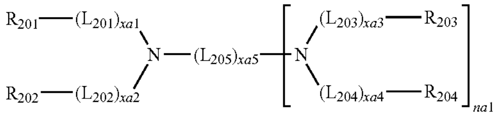

In Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $L_{205}$ may be *—O—*', *—S—*', *—N($Q_{201}$)-*', a $C_1$-$C_{20}$ alkylene group that is unsubstituted or substituted with at least one $R_{10a}$, a $C_2$-$C_{20}$ alkenylene group that is unsubstituted or substituted with at least one $R_{10a}$, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $R_{201}$ and $R_{202}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group (for example, a carbazole group) that is unsubstituted or substituted with at least one $R_{10a}$ (for example, see Compound HT16), $R_{203}$ and $R_{204}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group that is unsubstituted or substituted with at least one $R_{10a}$, and na1 may be an integer from 1 to 4.

In an embodiment, Formulae 201 and 202 may each include at least one of groups represented by Formulae CY201 to CY217:

CY201

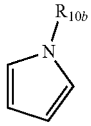

CY202

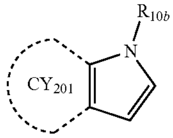

CY203

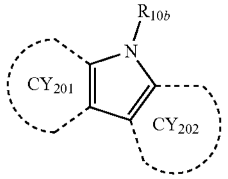

CY204

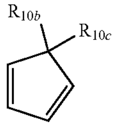

CY205

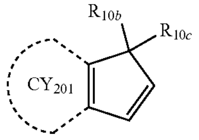

CY206

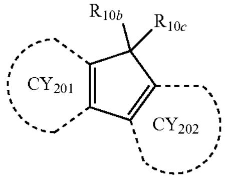

CY207

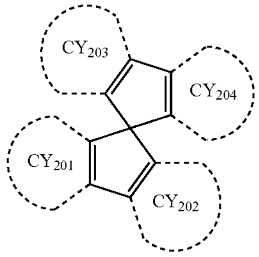

CY208

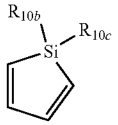

-continued

CY209

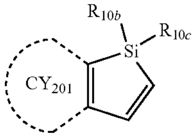

CY210

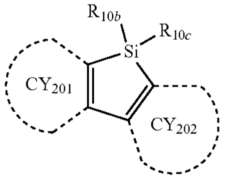

CY211

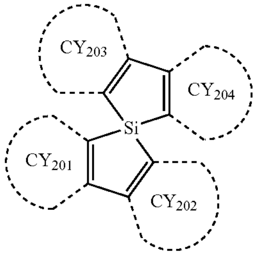

CY212

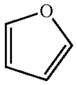

CY213

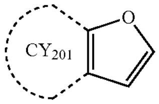

CY214

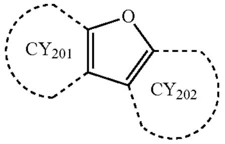

CY215

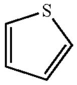

-continued

CY216

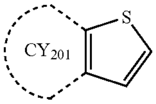

CY217

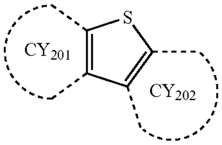

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, Formulae 201 and 202 may each include at least one of groups represented by Formulae CY201 to CY203.

In an embodiment, Formula 201 may include at least one of groups represented by Formulae CY201 to CY203 and at least one of groups represented by Formulae CY204 to CY217.

In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207.

In an embodiment, each of Formulae 201 and 202 may not include groups represented by Formulae CY201 to CY203.

In an embodiment, each of Formulae 201 and 202 may not include groups represented by Formulae CY201 to CY203, and may include at least one of groups represented by Formulae CY204 to CY217.

In an embodiment, each of Formulae 201 and 202 may not include groups represented by Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate) (PANI/PSS), or any combination thereof:

HT1
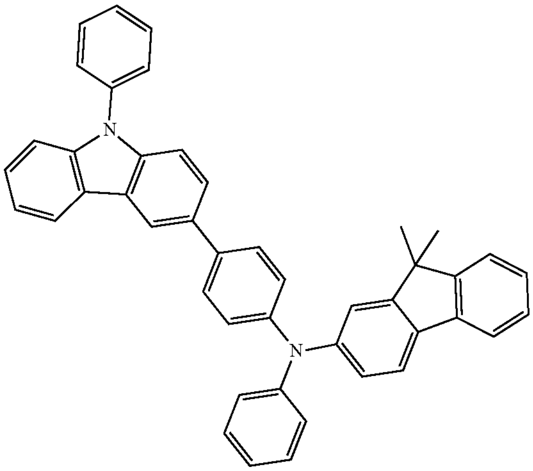
HT2
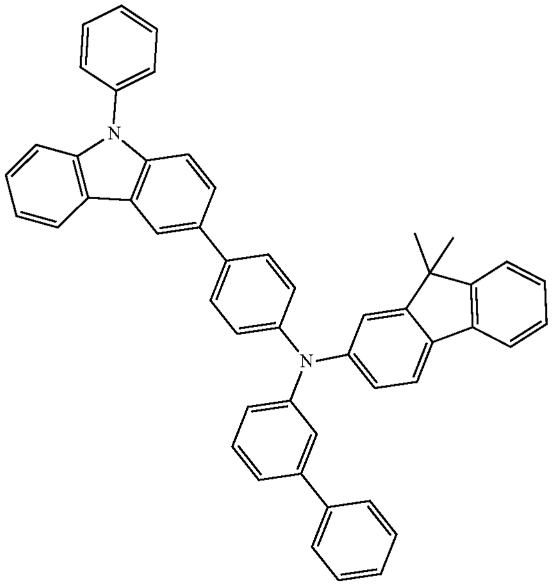
HT3
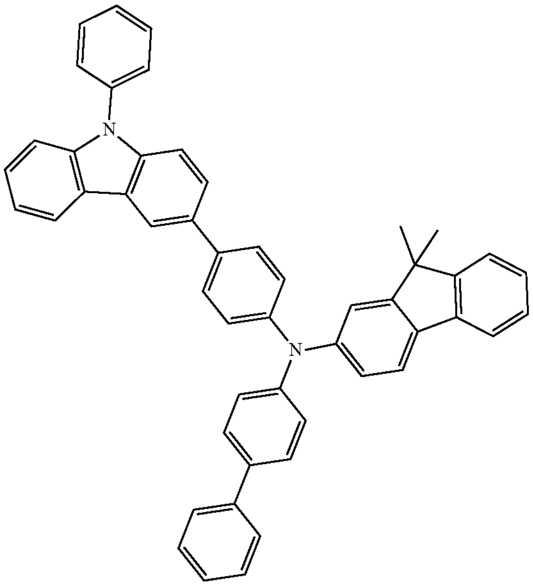
HT4
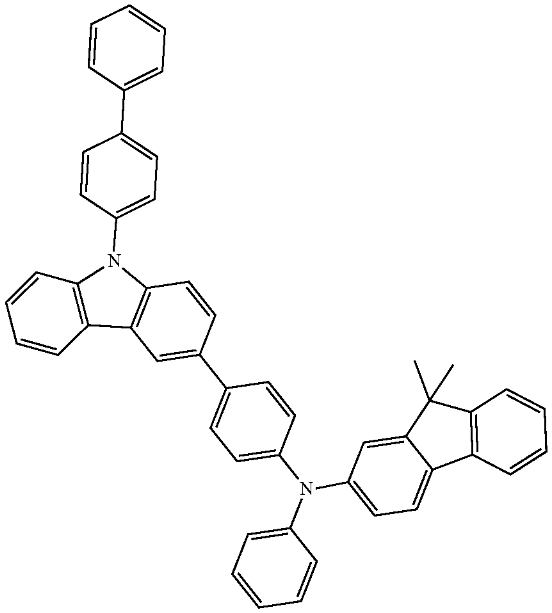

-continued
HT5
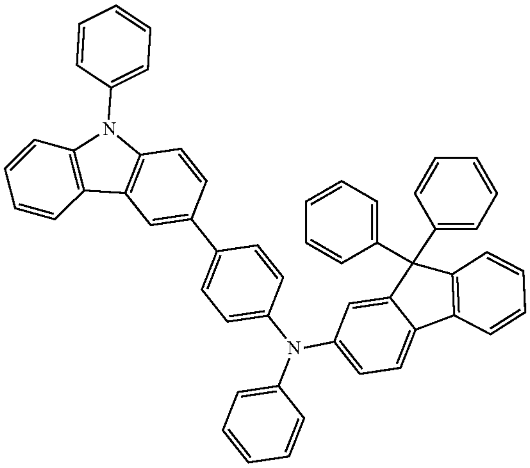
HT6
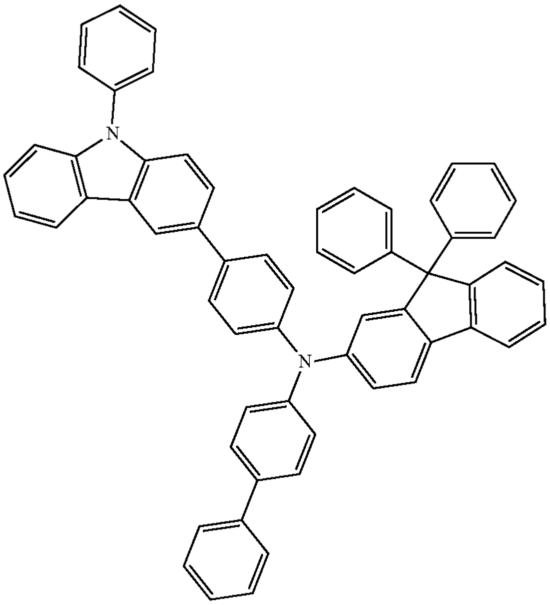
HT7
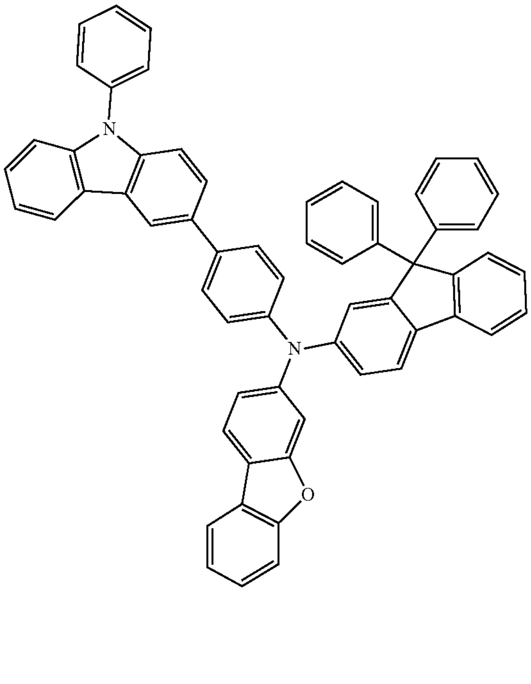
HT8
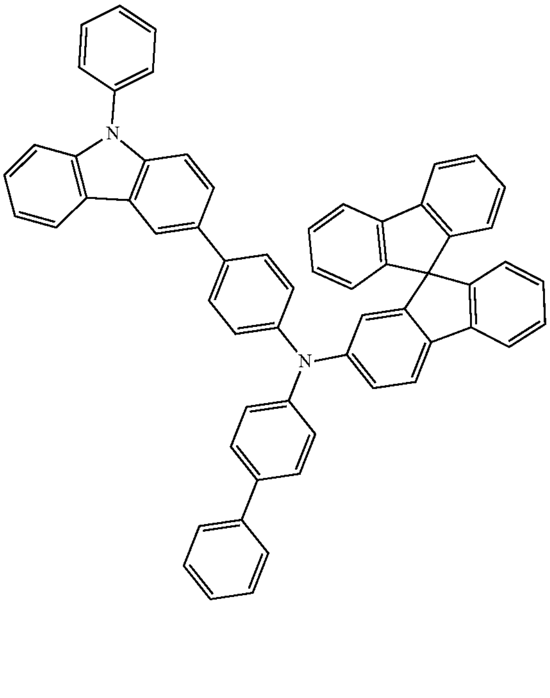

-continued
HT9
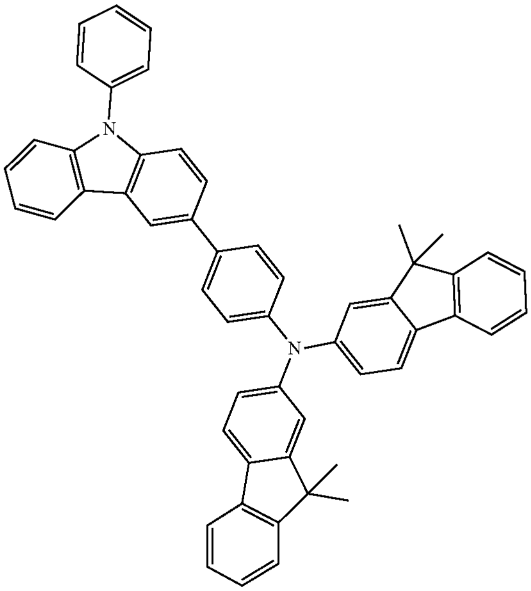
HT10
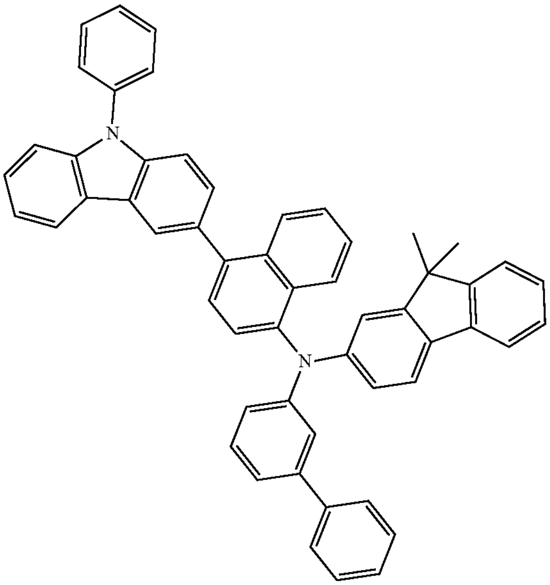
HT11
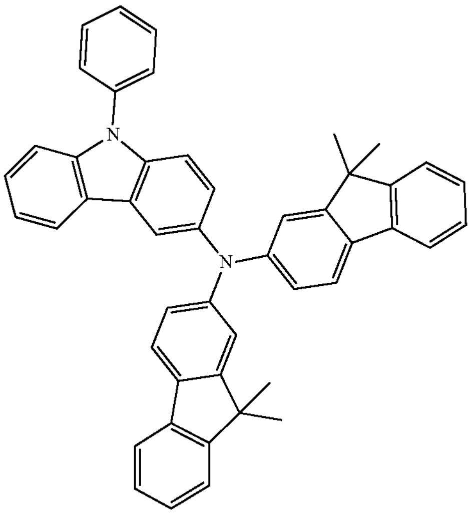
HT12
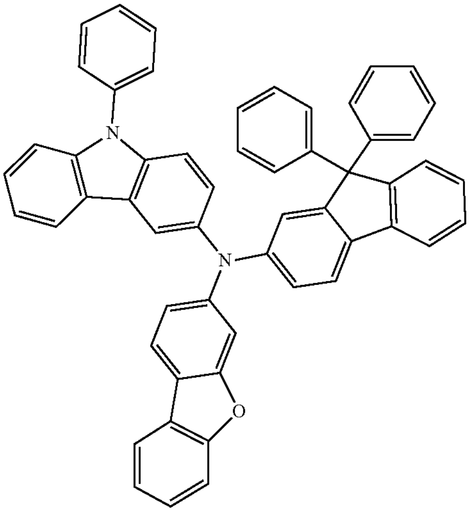

-continued
HT13
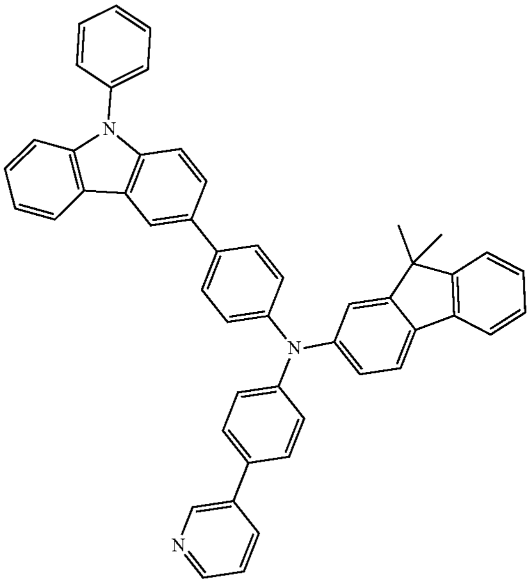
HT14
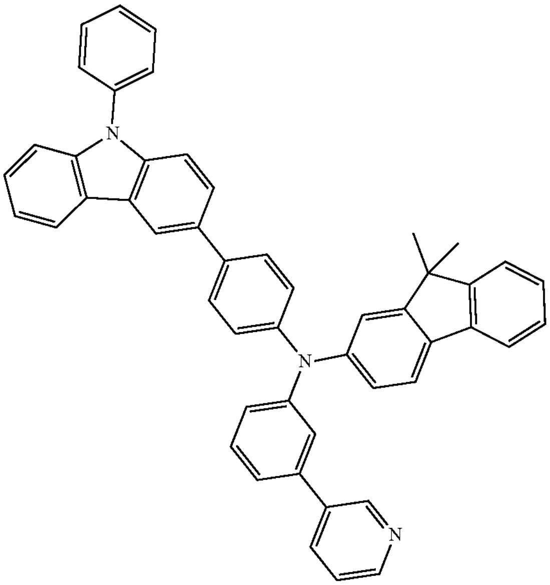
HT15
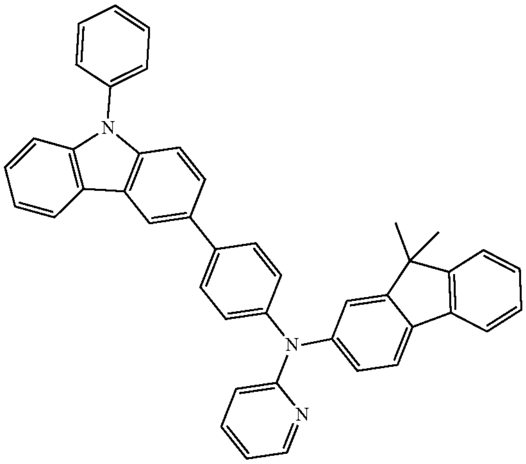
HT16
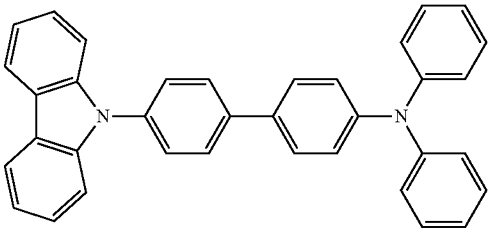
HT17
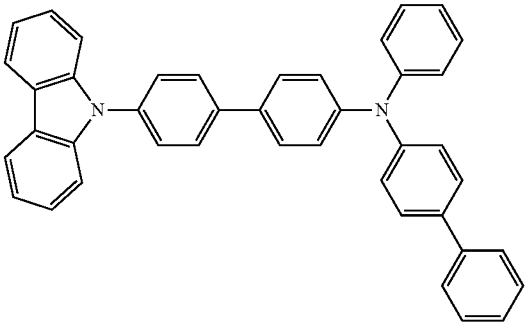
HT18
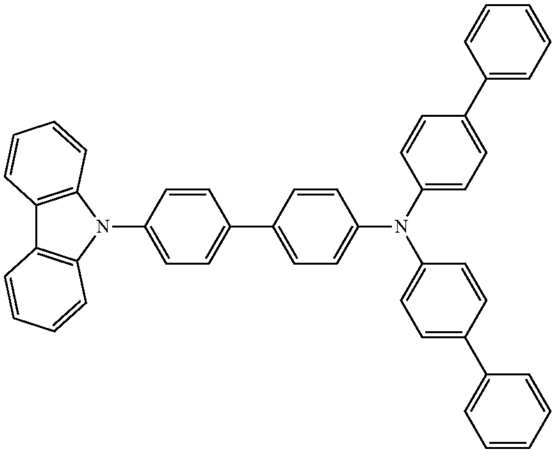

-continued
HT19
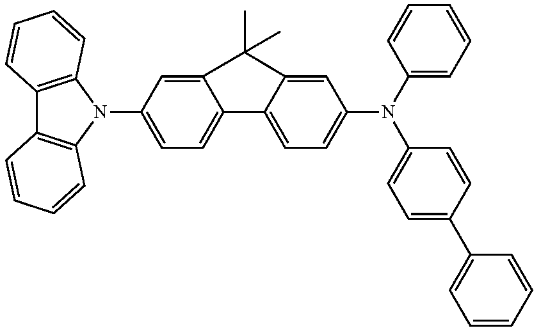
HT20
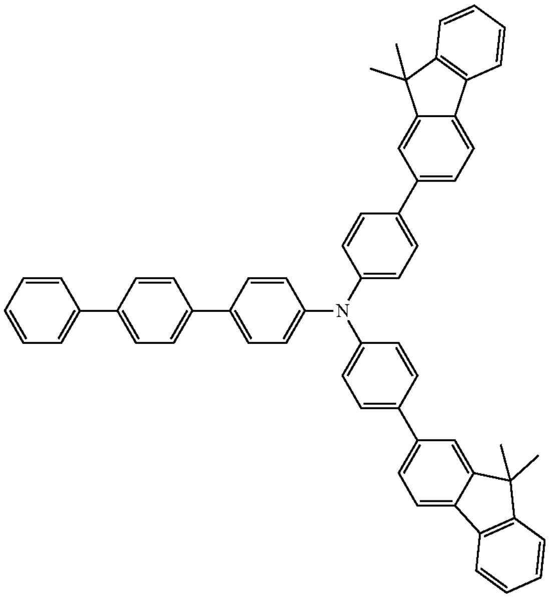
HT21
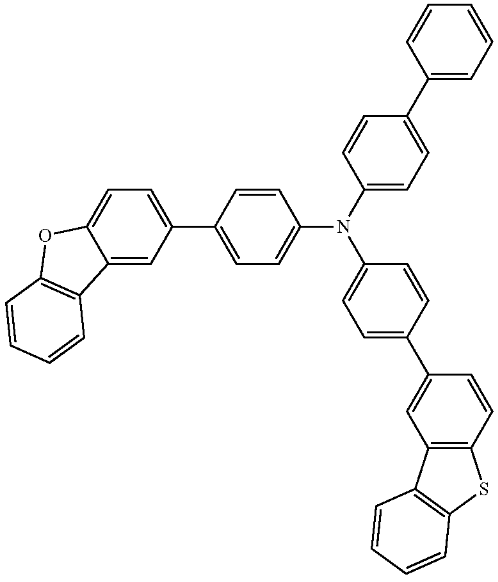
HT22
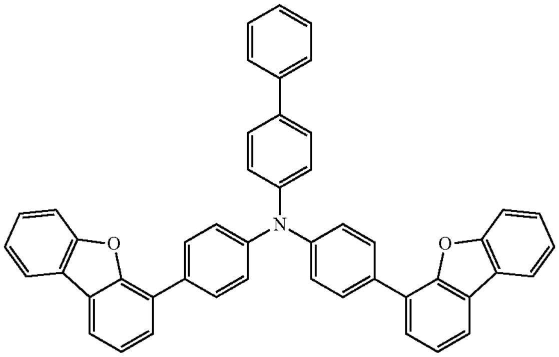

-continued
HT23
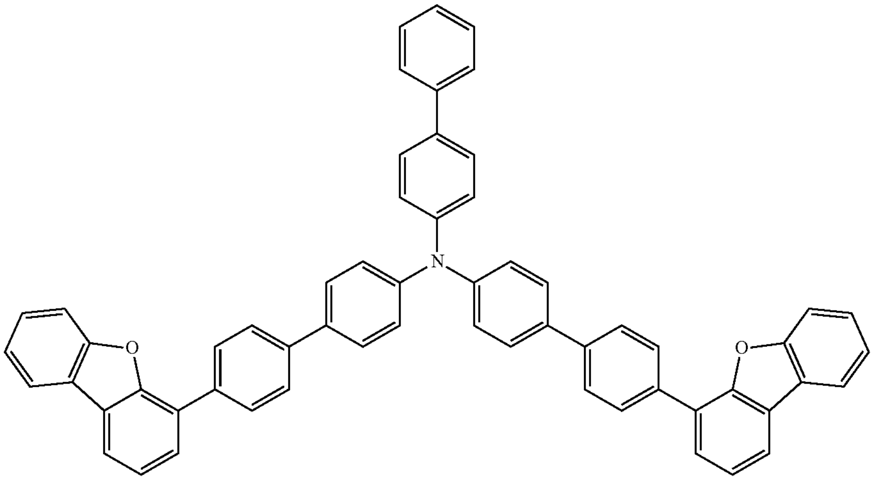
HT24
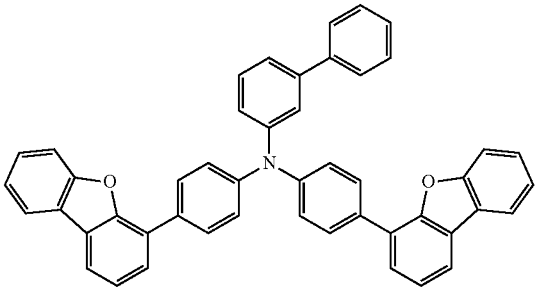
HT25
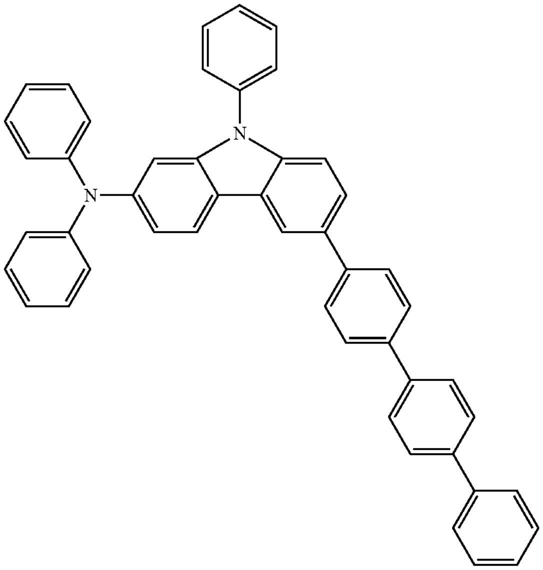
HT26
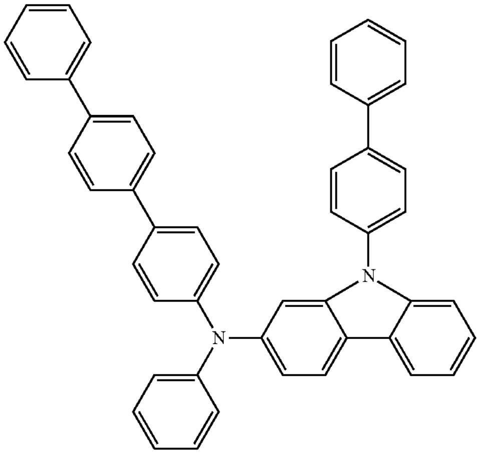
HT27
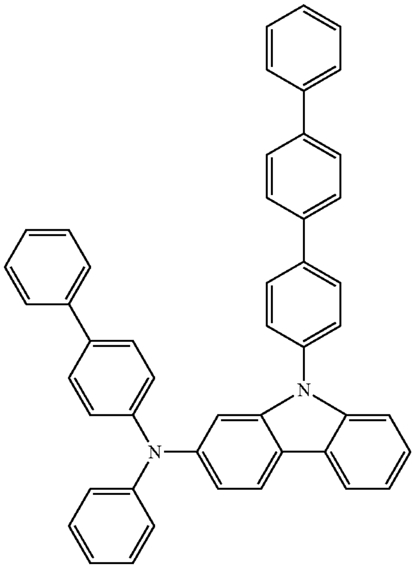

-continued
HT28
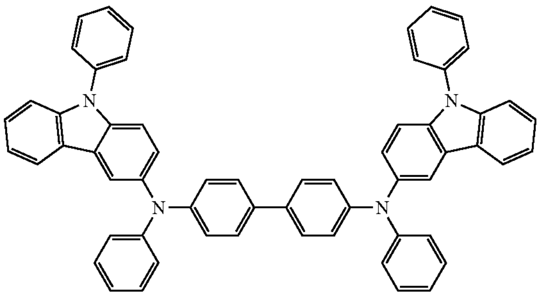
HT29
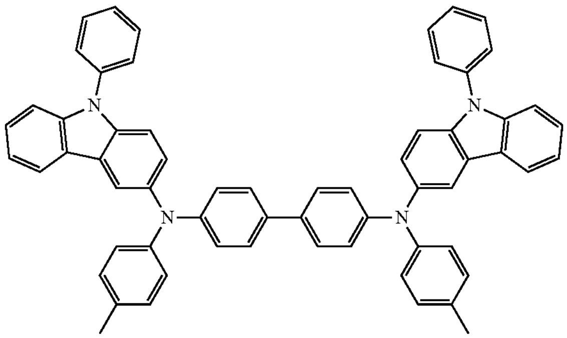
HT30
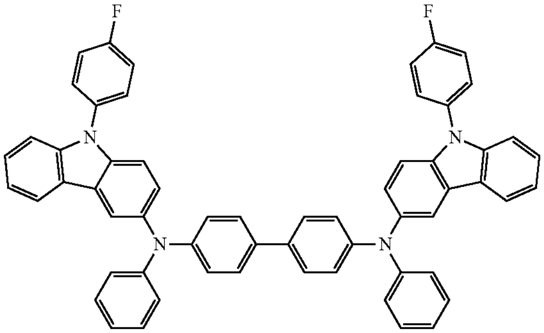
HT31
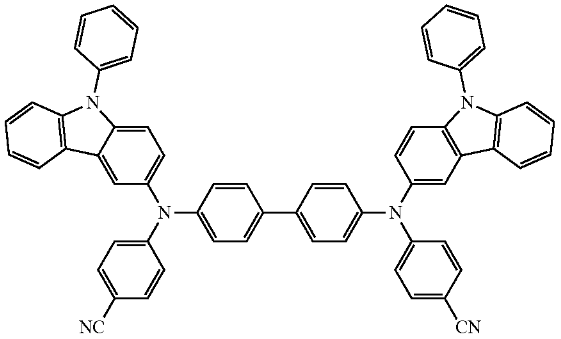
HT32
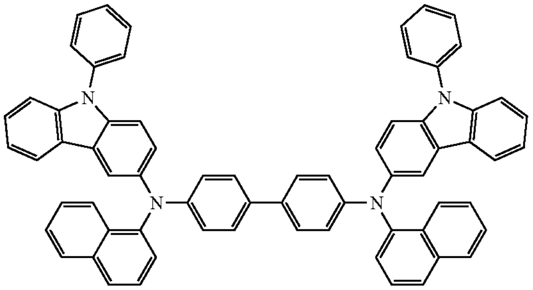
HT33
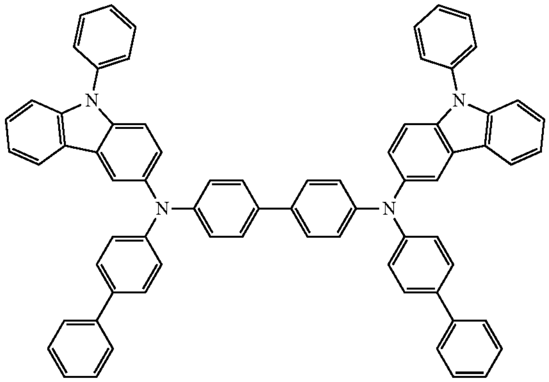
HT34
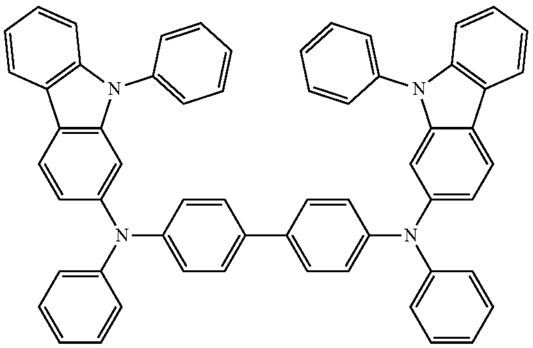
HT35
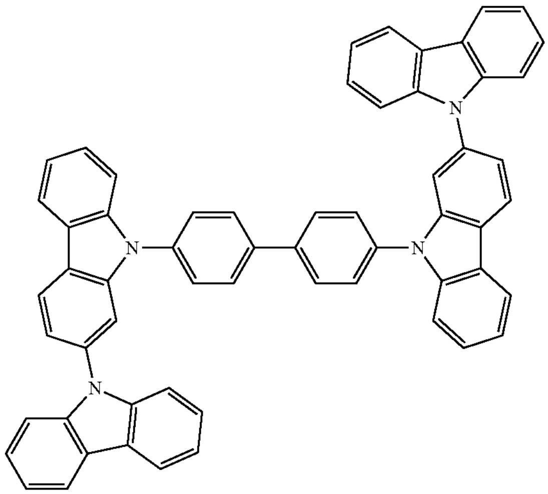

-continued
HT36
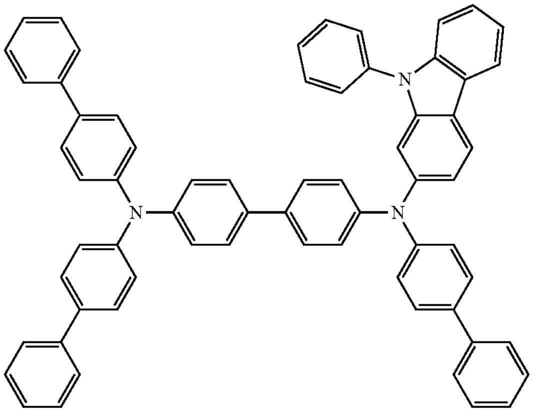
HT37
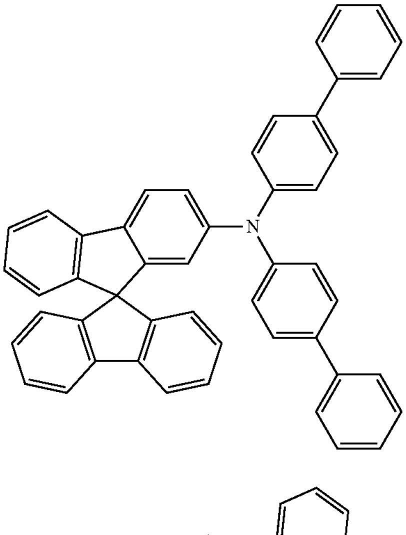
HT38
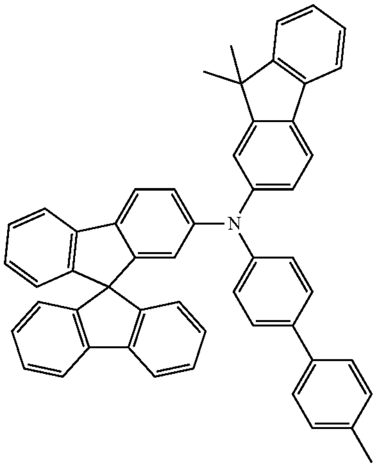
HT39
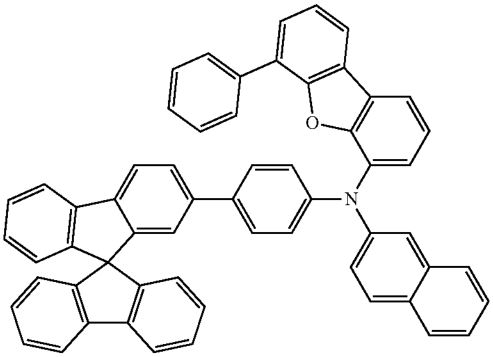
HT40
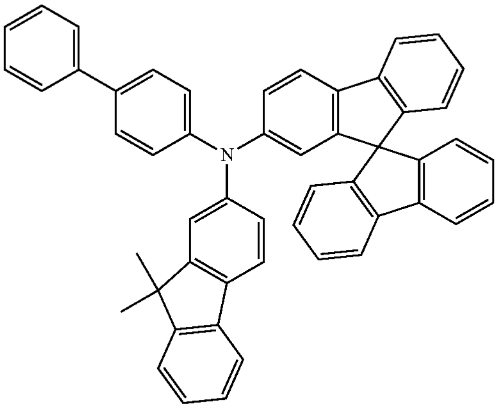
HT41
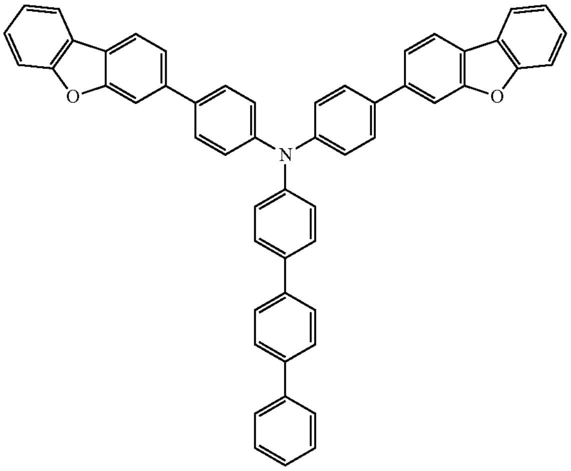

-continued
HT42
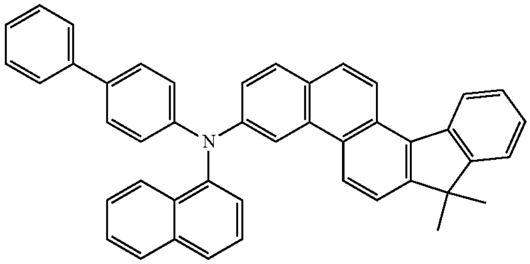
HT43
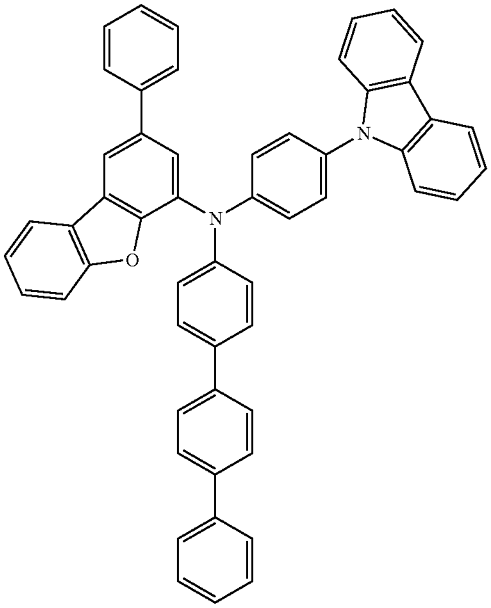
HT44
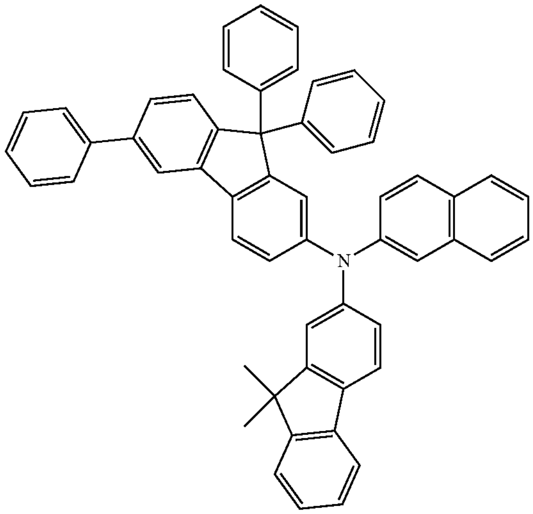
HT45
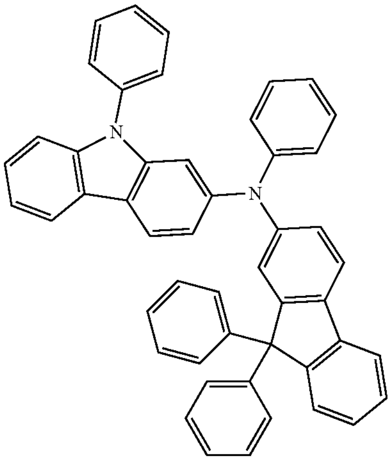

-continued
HT46
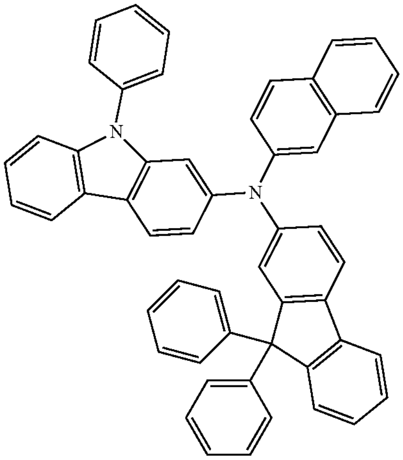
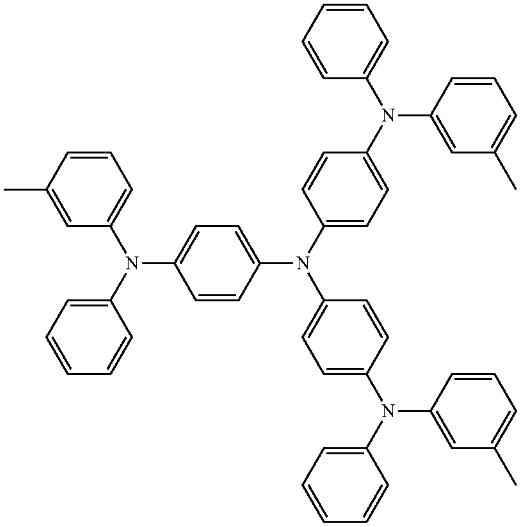
m-MTDATA
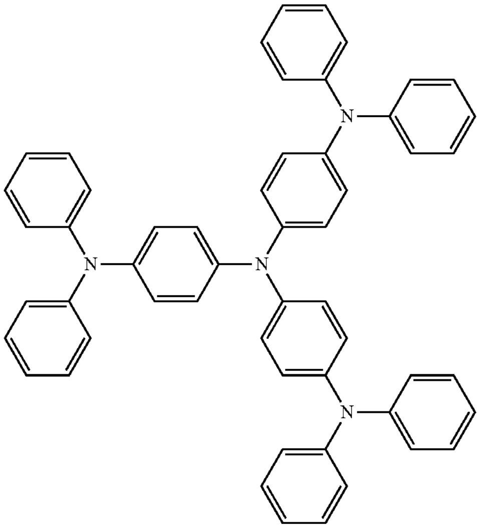
TDATA
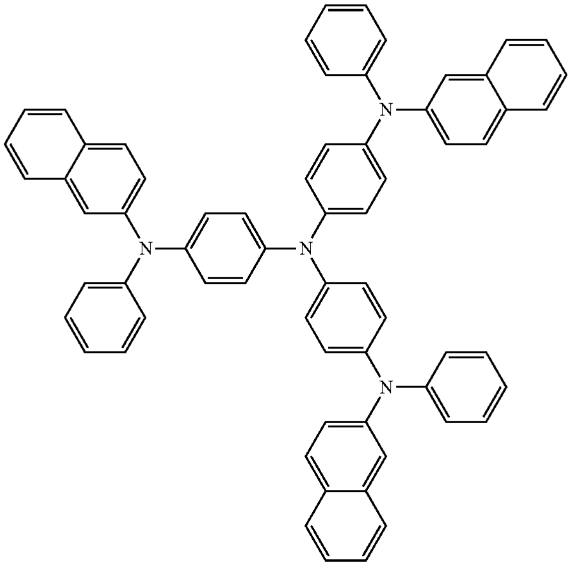
2-TNATA
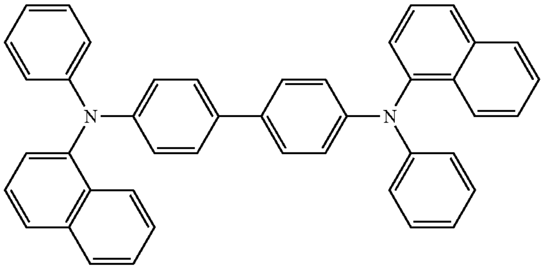
NPB
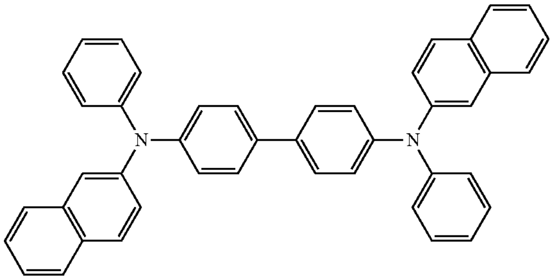
β-NPB -continued

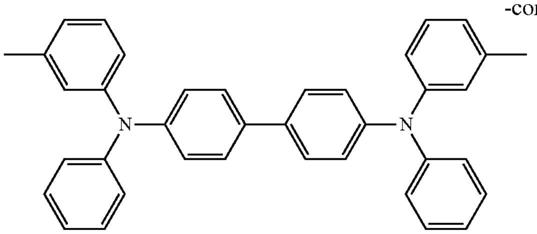

TPD

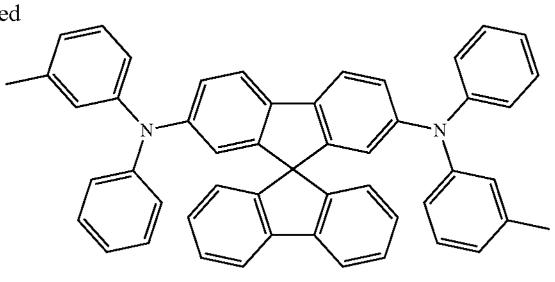

Spiro-TPD

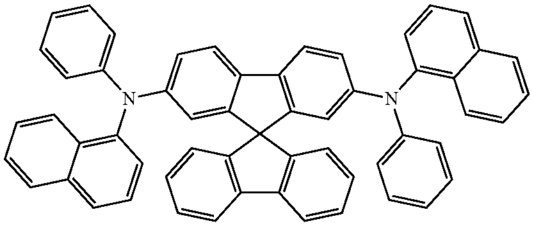

Spiro-NPB

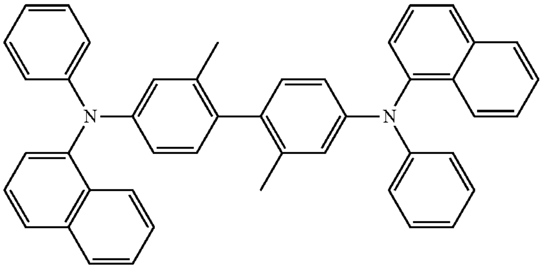

methylated-NPB

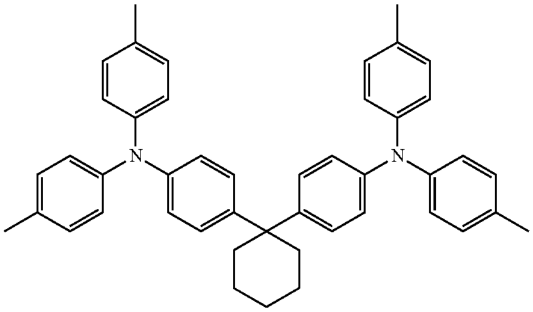

TAPC

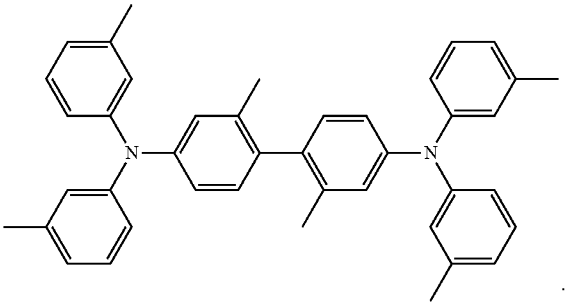

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å, and a thickness of the hole transport layer may be in a range of about 100 Å to about 1,500 Å. When the thicknesses of the hole transport region, the hole injection layer and the hole transport layer are within these ranges, satisfactory hole-transporting characteristics may be obtained without a substantial increase in driving voltage.

The emission auxiliary layer may increase light-emission efficiency by compensating for an optical resonance distance according to the wavelength of light emitted from the emission layer, and the electron blocking layer may block the leakage of electrons from the emission layer to the hole transport region. Materials that may be included in the hole transport region may be included in the emission auxiliary layer and the electron blocking layer.

[P-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, the lowest unoccupied molecular orbital (LUMO) energy level of the p-dopant may be less than or equal to about −3.5 eV.

In an embodiment, the p-dopant may include a quinone derivative, a cyano group-containing compound, a compound including an element EL1 and an element EL2, or any combination thereof.

Examples of the quinone derivative may include TCNQ, F4-TCNQ, and the like.

Examples of the cyano group-containing compound may include HAT-CN, a compound represented by Formula 221, and the like.

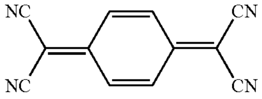

TCNQ

-continued

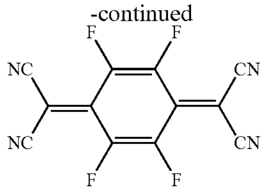

F4-TCNQ

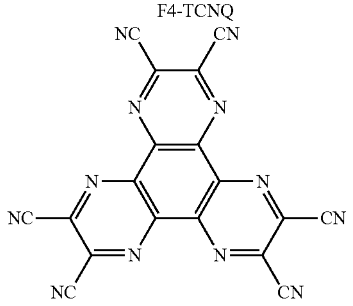

HAT-CN

[Formula 221]

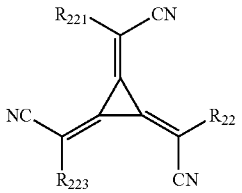

In Formula 221, $R_{221}$ to $R_{223}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group that is substituted with a cyano group, —F, —Cl, —Br, —I, or any combination thereof; or any combination thereof.

In the compound including the element EL1 and the element EL2, the element EL1 may be a metal, a metalloid, or any combination thereof, and the element EL2 may be a non-metal, a metalloid, or any combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

In an embodiment, examples of the compound containing the element EL1 and the element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), and a rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, Belt, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, Tali, etc.), a chromium halide (for example, $CrF_3$, $CrCl_3$, $CrBr_3$, $Cr_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, Felt, etc.), a ruthenium halide (for example, $RuF_2$, $RuCl_2$, $RuBr_2$, Rule, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a sub-pixel. In an embodiment, the emission layer may have a stacked structure of two or more layers of a red emission layer, a green emission layer, and a blue emission layer, in which the two or more layers may contact each other or may be separated from each other. In an embodiment, the emission layer may include two or more materials of a red light-emitting material, a green light-emitting material, and a blue light-emitting material, in which the two or more materials may be mixed with each other in a single layer to emit white light.

The emission layer may be prepared using the quantum dot ink composition.

A thickness of the emission layer may be in a range of about 100 Å to about 1,000 Å. For example, the thickness of the emission layer may be in a range of about 200 Å to about 600 Å. When the thickness of the emission layer is within these ranges, excellent light-emission characteristics may be obtained without a substantial increase in driving voltage.

[Quantum Dot]

In the specification, a quantum dot may be a crystal of a semiconductor compound, and may include any material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot crystal. As the crystal grows, the organic solvent naturally acts as a dispersant coordinated on the surface of the quantum dot crystal and controls the growth of the crystal so that the growth of quantum dots may be controlled through a process which is more readily performed than vapor deposition methods, such as metal organic chemical vapor deposition (MOCVD) or molecular beam epitaxy (MBE), and which has a lower cost.

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the Group III-V semiconductor compound may further include Group II elements. Examples of the Group III-V semiconductor compound further including Group II elements may include InZnP, InGaZnP, InAlZnP, and the like.

Examples of the Group III-VI semiconductor compound may include: a binary compound, such GaS, GaSe, $Ga_2Se_3$, GaTe, InS, InSe, $In_2S_3$, $In_2Se_3$, or InTe; a ternary compound, such as $InGaS_3$, or $InGaSe_3$; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof.

The Group IV element or compound may include: a single element compound, such as Si or Ge; a binary compound, such as SiC or SiGe; or any combination thereof.

Each element included in a multi-element compound such as a binary compound, a ternary compound, and a quaternary compound, may exist in a particle with a uniform concentration or a non-uniform concentration.

In an embodiment, the quantum dot may have a single structure or a core-shell structure. In the case of the quantum dot having a single structure, the concentration of each element included in the corresponding quantum dot may be uniform. In an embodiment, in case that the quantum dot has a core-shell structure a material contained in the core and a material contained in the shell may be different from each other.

The shell of the quantum dot may serve as a protective layer to prevent chemical degeneration of the core to maintain semiconductor characteristics and/or as a charging layer to impart electrophoretic characteristics to the quantum dot. The shell may be a single layer or a multi-layer. An element presented in the interface between the core and the shell of the quantum dot may have a concentration gradient that decreases toward the core.

Examples of the material forming the shell of the quantum dot may include a metal oxide, a metalloid oxide, or a non-metal oxide, a semiconductor compound, or any combination thereof. Examples of the metal oxide, the metalloid oxide, or the non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, $CoMn_2O_4$; or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be less than or equal to about 45 nm. For example, the quantum do may have an FWHM of the emission wavelength spectrum of less than or equal to about 40 nm. For another example, the quantum dot may have an FWHM of the emission wavelength spectrum of the quantum dot of less than or equal to about 30 nm. When the FWHM of the quantum dot is within these ranges, color purity or color reproducibility may be increased. Light emitted through the quantum dot may be emitted in all directions, so that a wide viewing angle may be improved.

The quantum dot may be a spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having various wavelength bands may be obtained from the quantum dot emission layer. By utilizing quantum dots of different sizes, a light-emitting device that emits light of various wavelengths may be implemented. In an embodiment, the size of the quantum dot may be selected to emit red, green and/or blue light. The size of the quantum dot may be configured to emit white light by combining light of various colors.

[Electron Transport Region in Interlayer 130]

The electron transport region may have: a structure consisting of a layer consisting of a single material, a structure consisting of a layer including different materials, or a structure including layers including different materials.

The electron transport region may include a hole blocking layer, an electron transport layer, an electron injection layer, or any combination thereof.

For example, the electron transport region may have an electron transport layer/electron injection layer structure, a hole blocking layer/electron transport layer/electron injection layer structure, or the like, the constituting layers of each structure may be stacked from the emission layer in its respective stated order, but the structure of the electron transport region is not limited thereto.

The electron transport region (for example, the hole blocking layer or the electron transport layer in the electron transport region) may include a metal-free compound including at least one Tr electron-deficient nitrogen-containing $C_1$-$C_{60}$ cyclic group.

In an embodiment, the electron transport region may include a compound represented by Formula 601:

[Formula 601]

$$[Ar_{601}]_{xe11}—[(L_{601})_{xe1}—R_{601}]_{xe21}$$

In Formula 601, $Ar_{601}$ and $L_{601}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{0601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group that is unsubstituted or substituted with at least one $R_{10a}$.

In an embodiment, in Formula 601 when xe11 is 2 or more, two or more $Ar_{601}$ (s) may be linked to each other via a single bond.

In an embodiment, in Formula 601 $Ar_{601}$ may be a substituted or unsubstituted anthracene group.

In an embodiment, the electron transport region may include a compound represented by Formula 601-1:

[Formula 601-1]

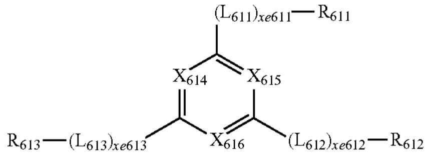

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may each be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$.

In an embodiment, in Formulae 601 and 601-1 xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

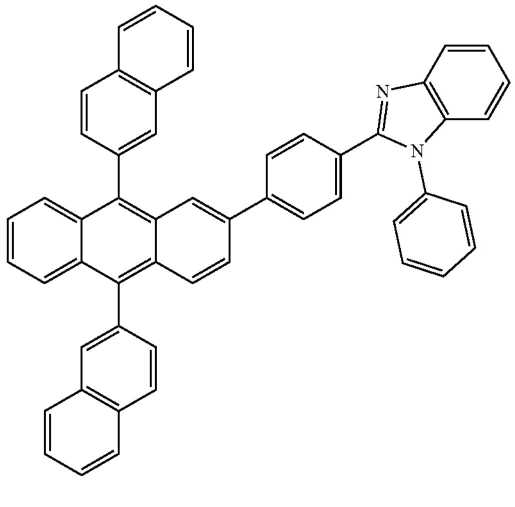

-continued
ET2
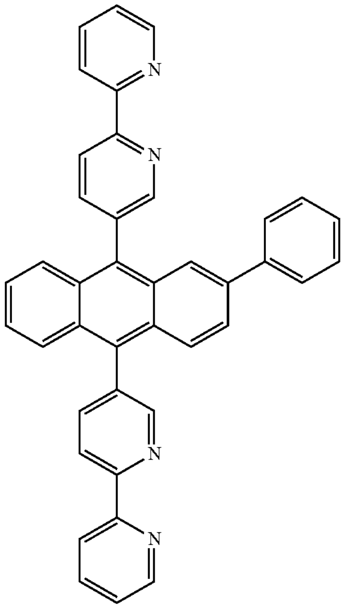
ET3
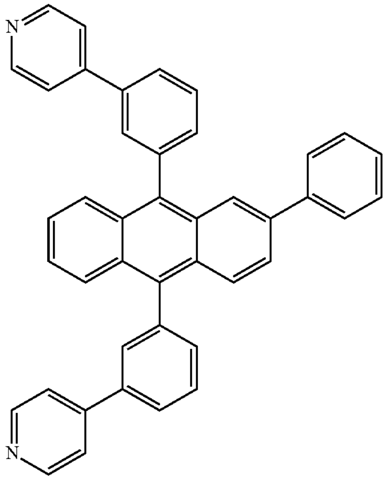
ET4
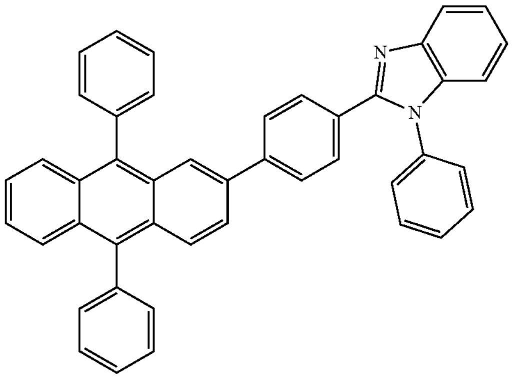
-continued
ET5
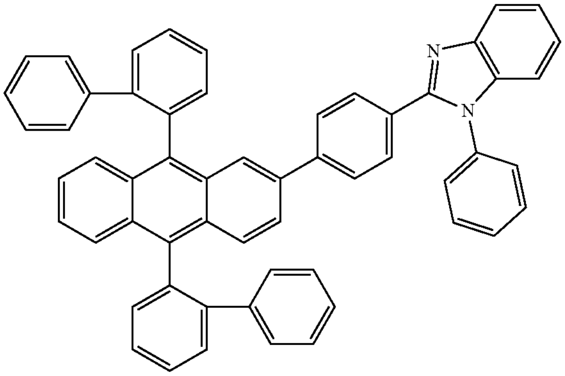
ET6
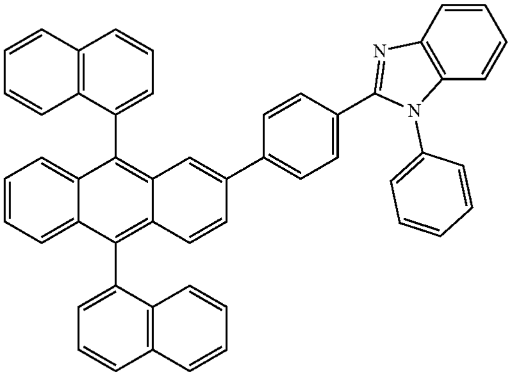
ET7
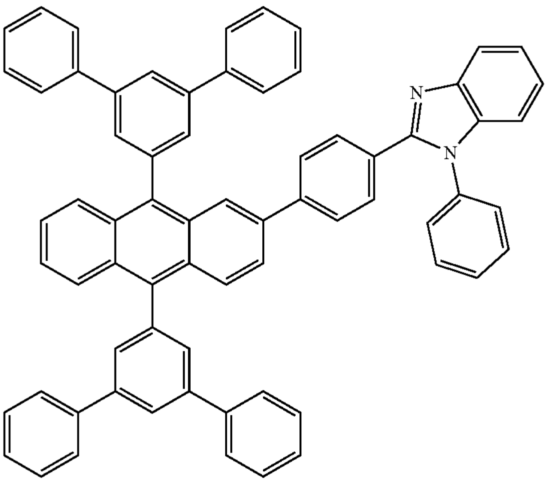

-continued
ET8
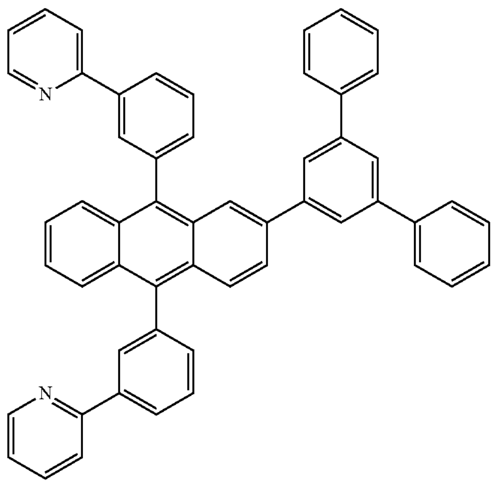
ET9
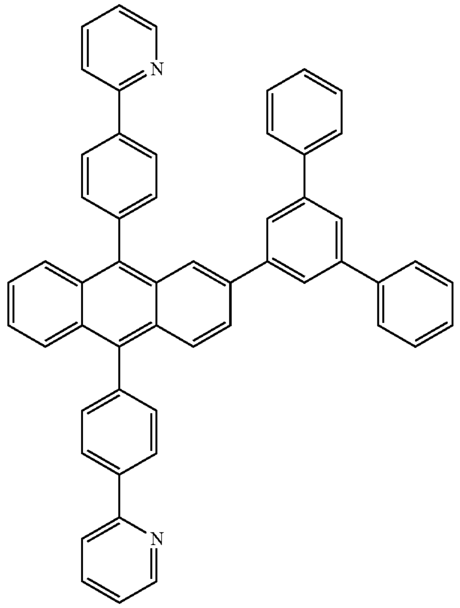
-continued
ET10
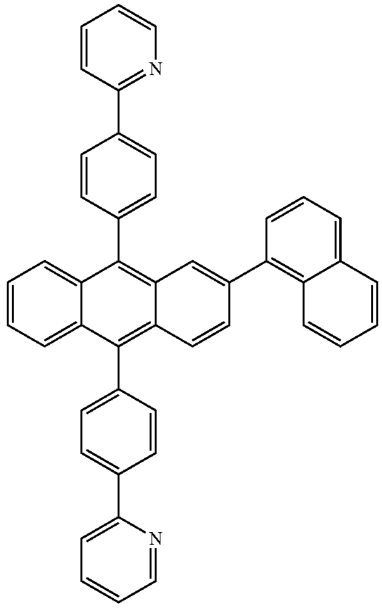
ET11
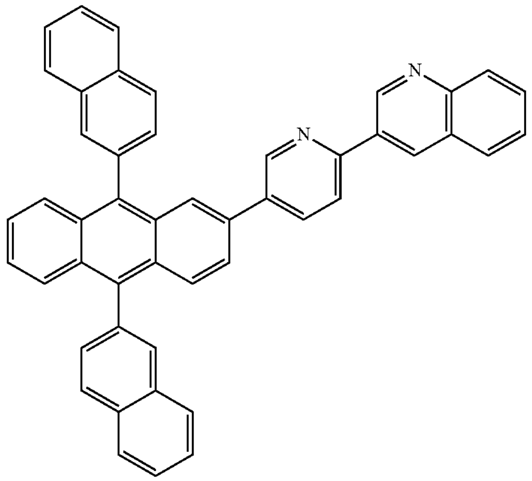
ET12
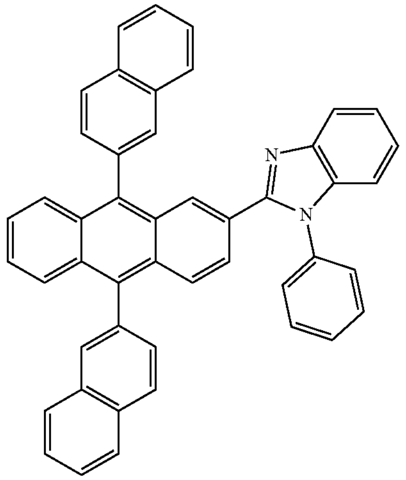

-continued
ET13
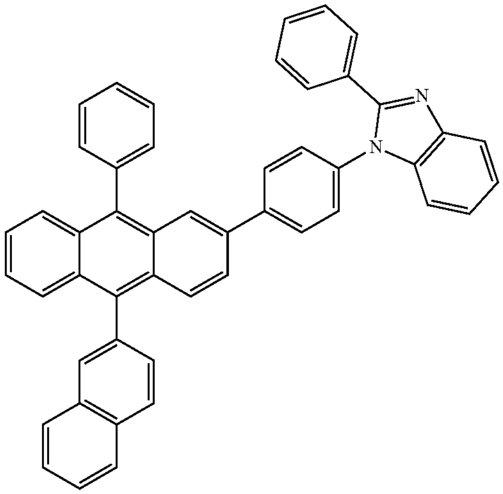
ET14
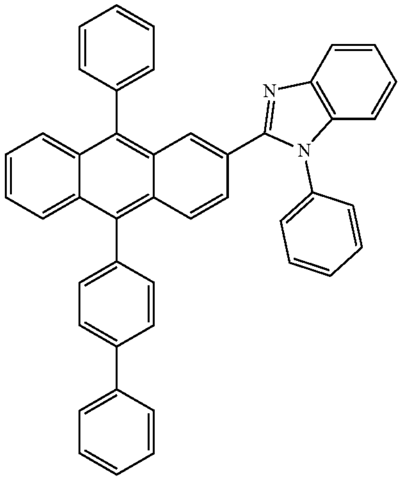
ET15
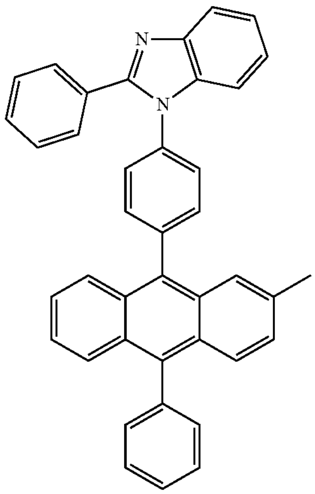
-continued
ET16
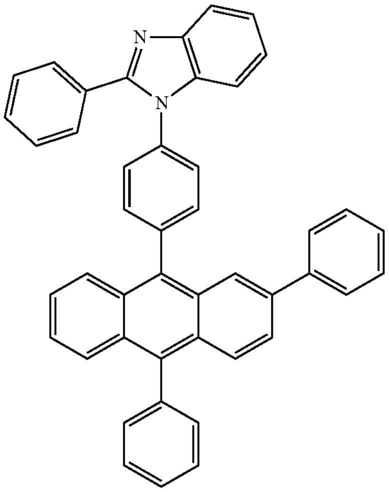
ET17
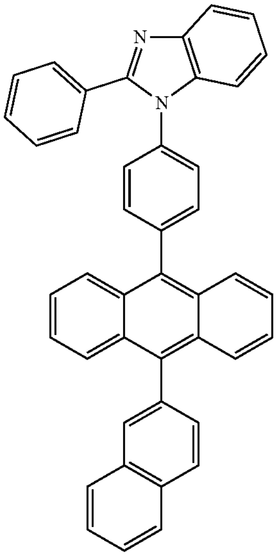
ET18
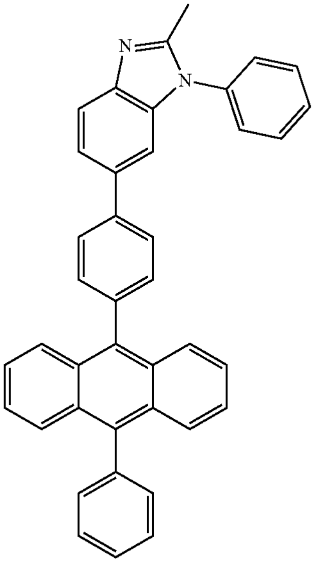

-continued
ET19
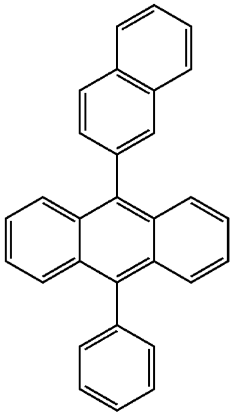
ET20
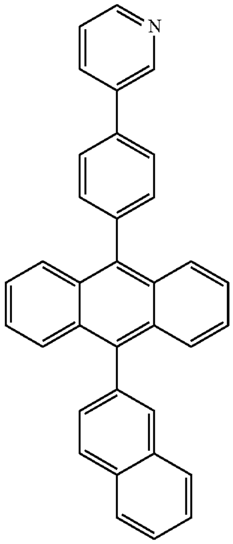
ET21
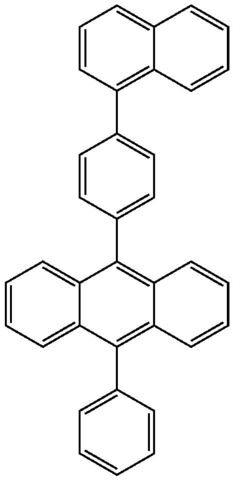
-continued
ET22
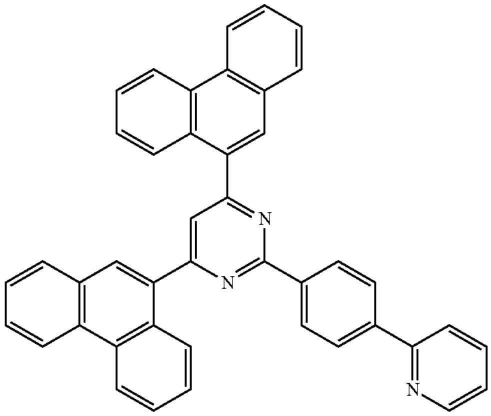
ET23
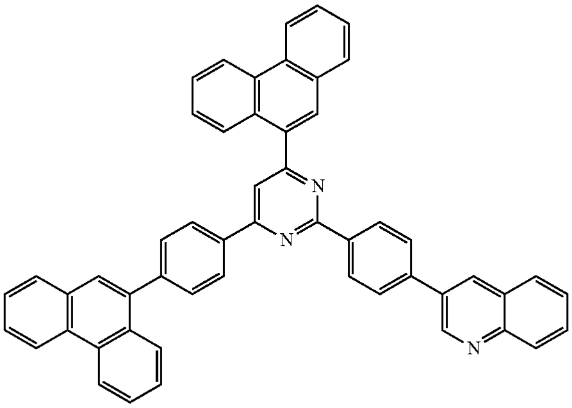
ET24
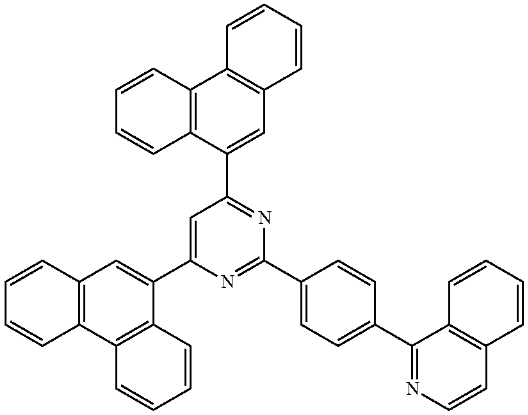

-continued
ET25
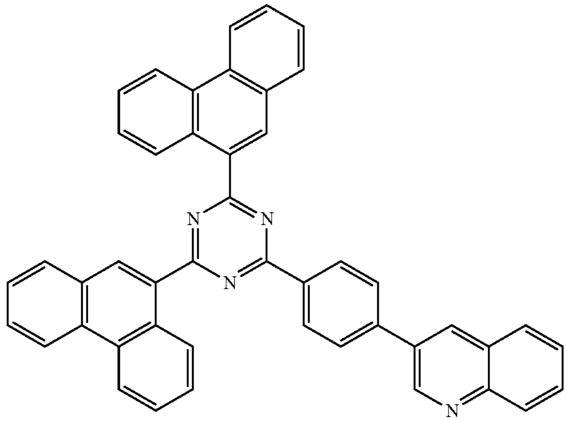
ET26
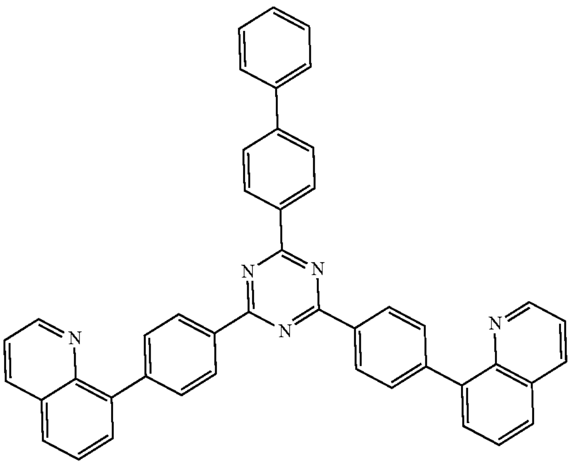
ET27
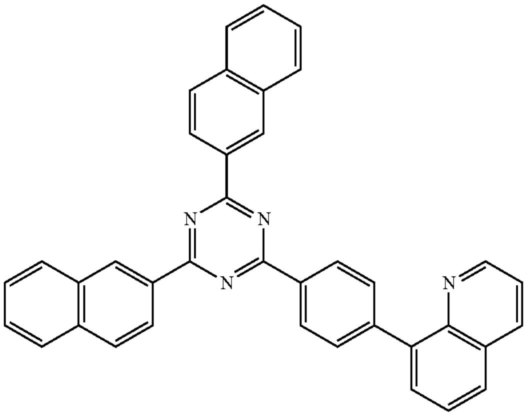
-continued
ET28
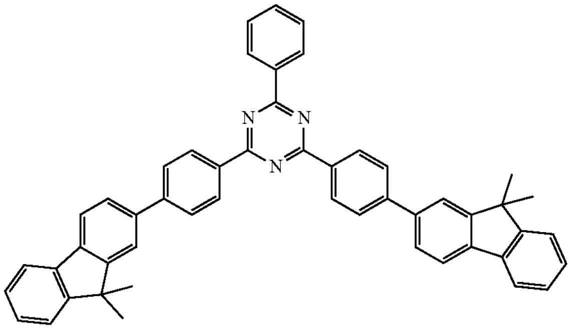
ET29
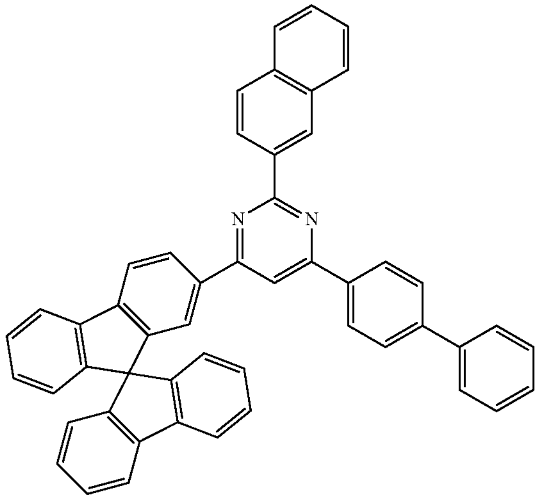
ET30
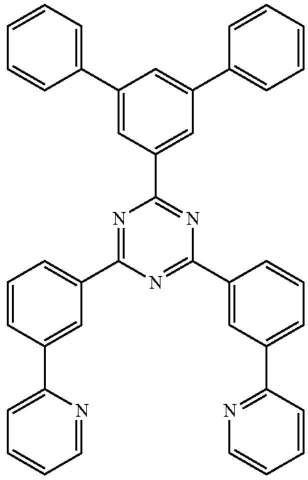

-continued
ET31
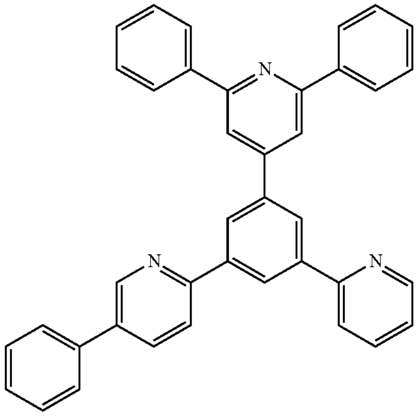
ET32
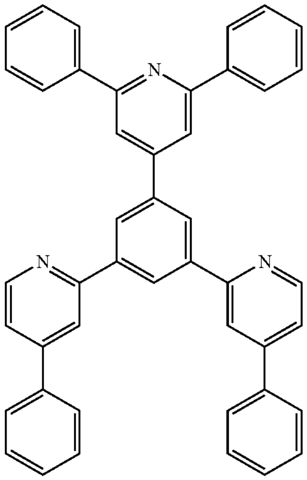
ET33
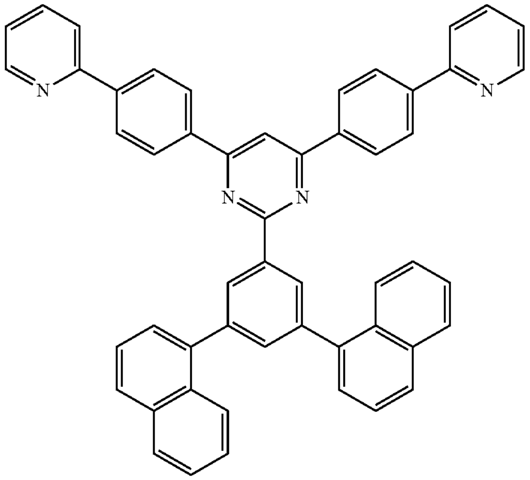
-continued
ET34
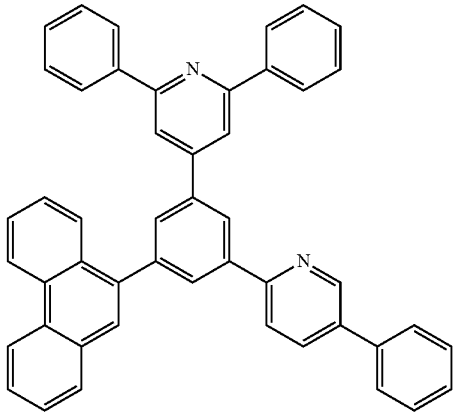
ET35
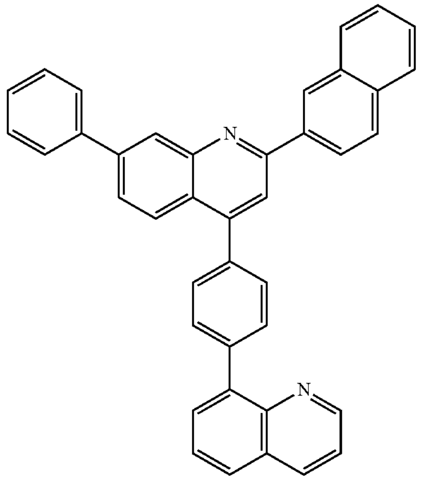
ET36
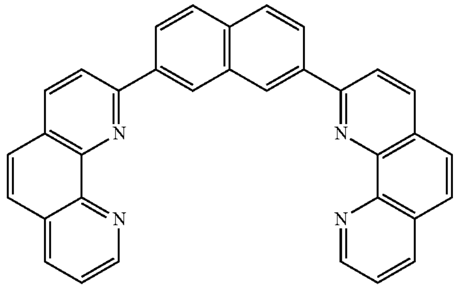
ET37
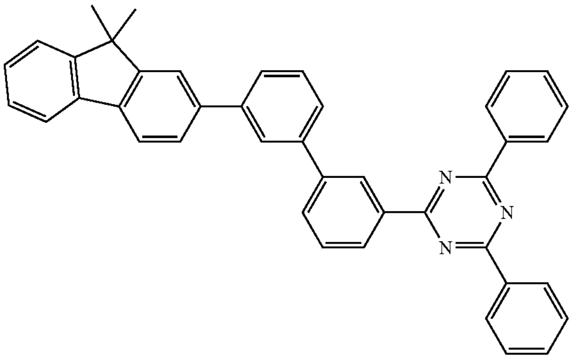

-continued
ET38
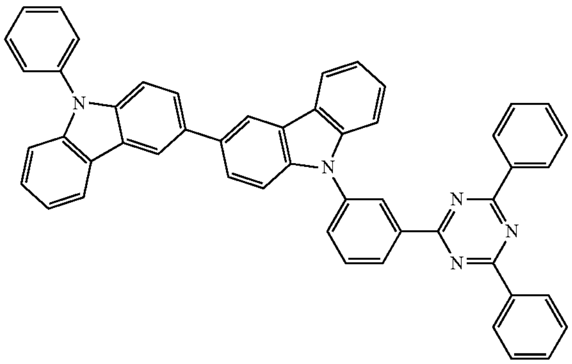
ET39
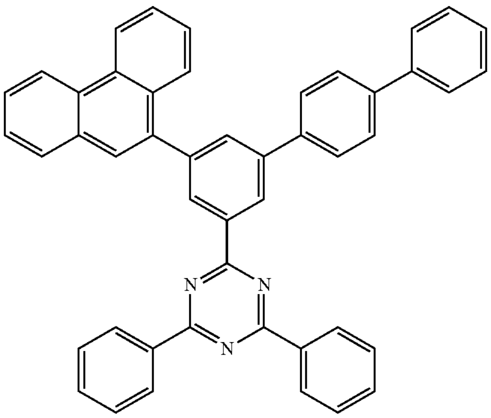
ET40
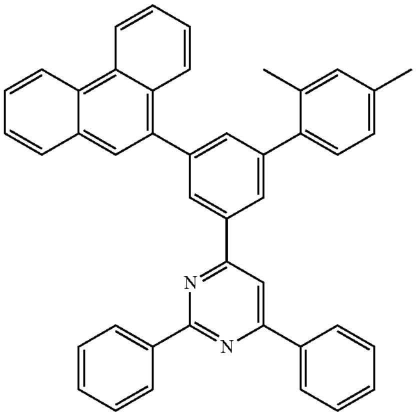
-continued
ET41
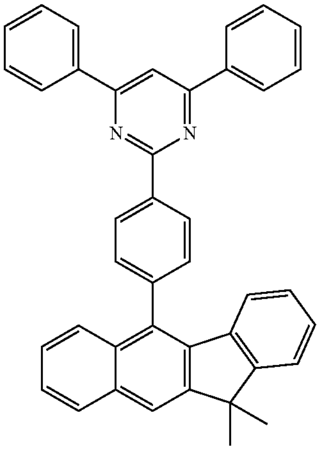
ET42
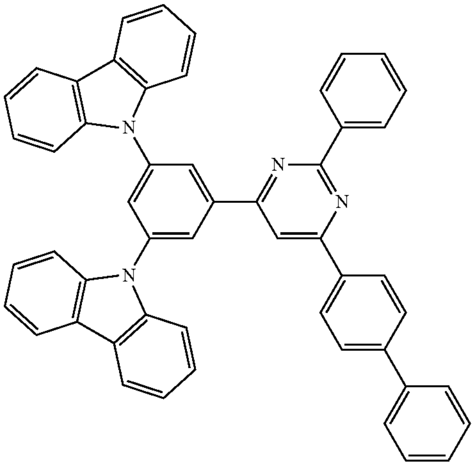
ET43
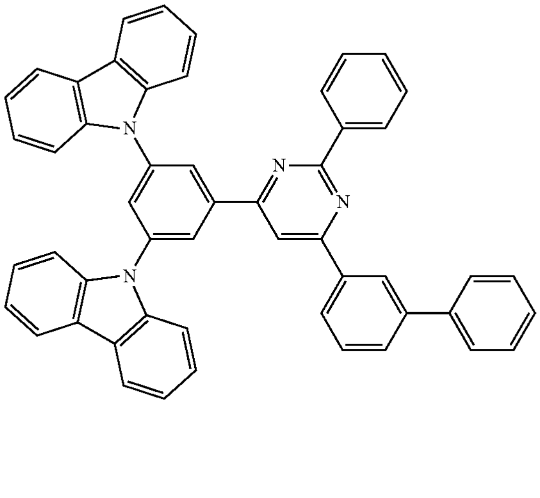

-continued

ET44

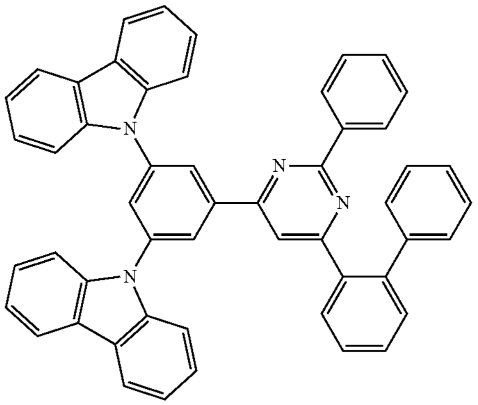

ET45

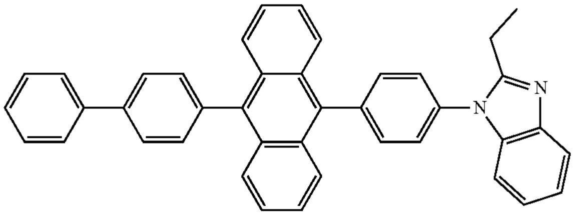

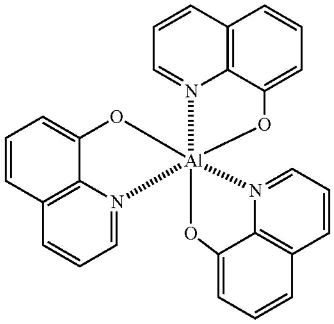

Alq3

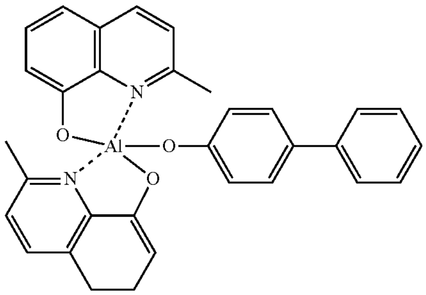

BAlq

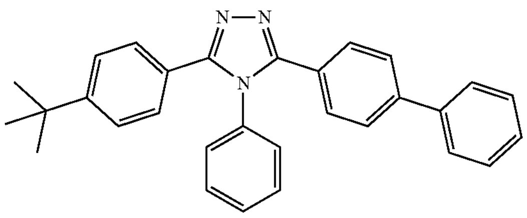

TAZ

-continued

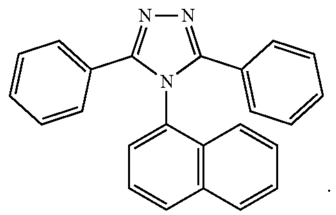

NTAZ

A thickness of the electron transport region may be about 100 Å to about 5,000 Å. For example, the thickness of the electron transport region may be about 160 Å to about 4,000 Å. When the electron transport region includes the hole blocking layer, the electron transport layer, or any combination thereof, a thickness of the hole blocking layer or the electron transport layer may each independently be in a range of about 20 Å to about 1,000 Å, for example, and a thickness of the electron transport layer may be in a range of about 100 Å to about 1,000 Å. For example, the thickness of the hole blocking layer or the electron transport layer may each independently be in a range of about 30 Å to about 300 Å, and the thickness of the electron transport layer may be in a range of about 150 Å to about 500 Å. When the thicknesses of the hole blocking layer and/or electron transport layer are within the above-described ranges, satisfactory electron-transporting characteristics may be obtained without a substantial increase in driving voltage.

The electron transport region (for example, an electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or Compound ET-D2:

ET-D1

-continued

ET-D2

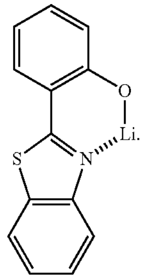

The electron transport region may include an electron injection layer to facilitate the injection of electrons from the second electrode 150. The electron injection layer may be in direct contact with the second electrode 150.

The electron injection layer may have: a structure consisting of a layer consisting of a single material, a single-layered structure consisting of a layer including different materials, or a structure including layers of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of an alkali metal ion, an alkaline earth metal ion, and a rare earth metal ion and a ligand bonded to the metal ion (for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof).

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of an alkali metal-containing compound (for example, an alkali metal halide), an alkali metal-containing compound (for example, an alkali metal halide), and an alkali metal, an alkaline earth metal, a rare earth metal, or any combination thereof. For example, the electron injection layer may be a KI:Yb co-deposited layer, a RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the above-describe range, satisfactory electron injection characteristics may be obtained without a substantial increase in driving voltage.

[Second Electrode 150]

The second electrode 150 may be located on the interlayer 130 having such a structure. The second electrode 150 may be a cathode, which is an electron injection electrode. A material for the second electrode 150, may be a material having a low work function, for example a metal, an alloy, an electrically conductive compound, or any combination thereof.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multilayer structure.

[Capping Layer]

The light emitting device may include a first capping layer outside the first electrode 110, and/or a second capping layer may be outside the second electrode 150. For example, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which may be a semi-transmissive electrode or a transmissive electrode, and through the first capping layer or light generated in an emission layer of the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may each include a material having a refractive index (with respect to a wavelength of about 589 nm) of about 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, β-NPB, or any combination thereof:

CP1

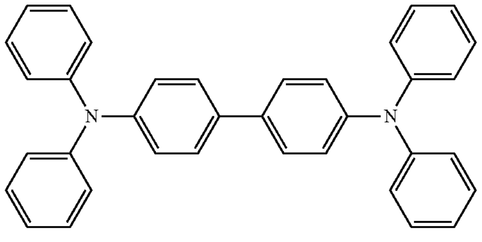

-continued

CP2

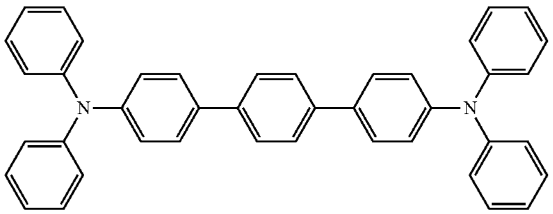

CP3

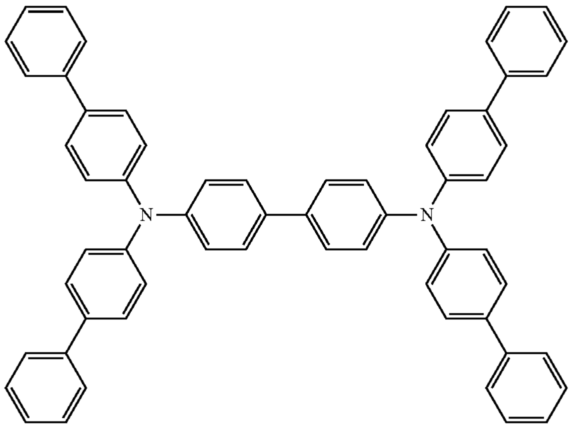

CP4

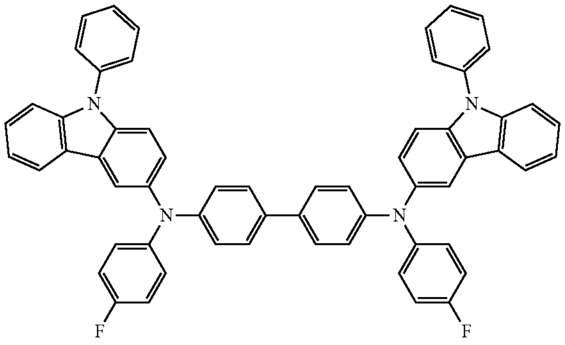

CP5

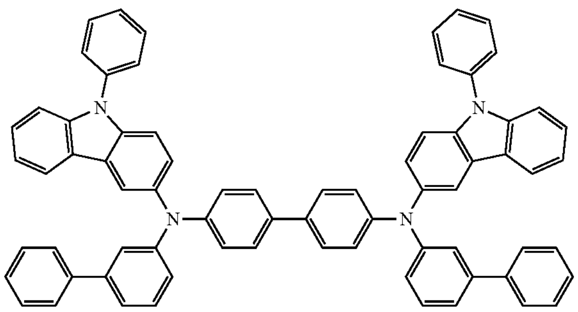

-continued

CP6

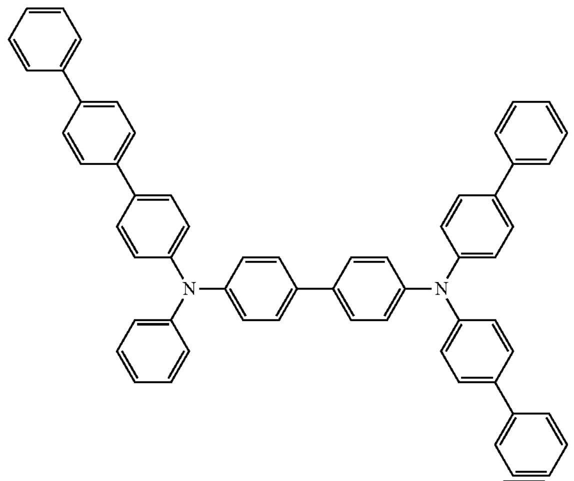

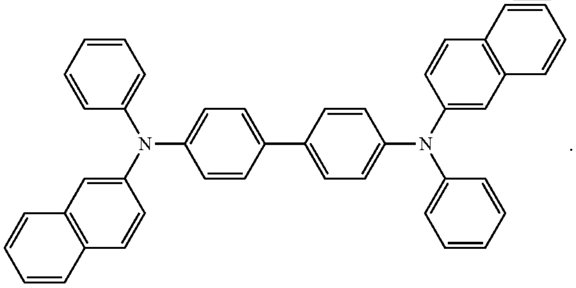

β-NPB

[Electronic Apparatus]

The light-emitting device may be included in various electronic apparatuses. In an embodiment, an electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. In an embodiment, the light emitted from the light-emitting device may be blue light or white light. The light-emitting device may be the same as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining layer may be located among the subpixels to define each subpixel.

The color filter may further include color filter areas and light-shielding patterns located among the color filter areas, and the color conversion layer may include color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. For example, the first area may include a red quantum dot, the second area may include a green quantum dot, and the third area may not include a quantum dot. The quantum dot may be the same as described in the specification. The first area, the second area, and/or the third area may each further include a scatterer.

In an embodiment, the light-emitting device may emit a first light, the first area may absorb the first light to emit a first first-color light, the second area may absorb the first light to emit a second first-color light, and the third area may absorb the first light to emit a third first-color light. The first first-color light, the second first-color light, and the third first-color light may each have different maximum emission wavelengths. For example, the first light may be blue light, the first first-color light may be red light, the second first-color light may be green light, and the third first-color light may be blue light.

The electronic apparatus may further include a thin-film transistor (TFT) in addition to the light-emitting device as described above. The TFT may include a source electrode, a drain electrode, and an activation layer, wherein any one of the source electrode and the drain electrode may be electrically connected to any one of the first electrode and the second electrode of the light-emitting device.

The TFT may further include a gate electrode, a gate insulating film, etc.

The activation layer may include crystalline silicon, amorphous silicon, an organic semiconductor, an oxide semiconductor, or the like.

The electronic apparatus may further include a sealing portion for sealing the light-emitting device. The sealing portion may be located between the color filter and/or the color-conversion layer and the light-emitting device. The sealing portion may allow light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the intended use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
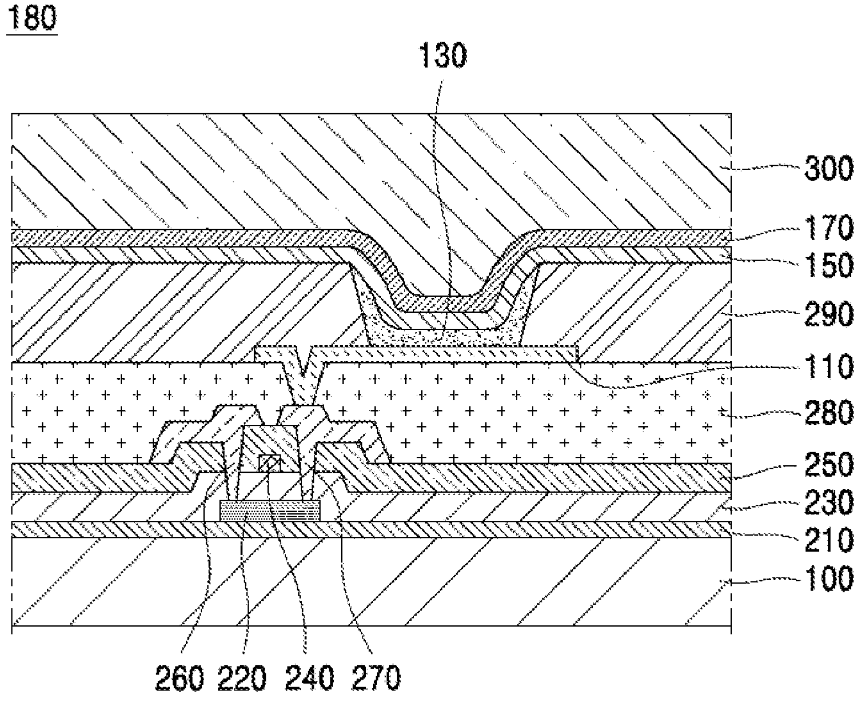
FIG. 2 is a schematic cross-sectional view of an electronic apparatus according to an embodiment.
Figure 3:
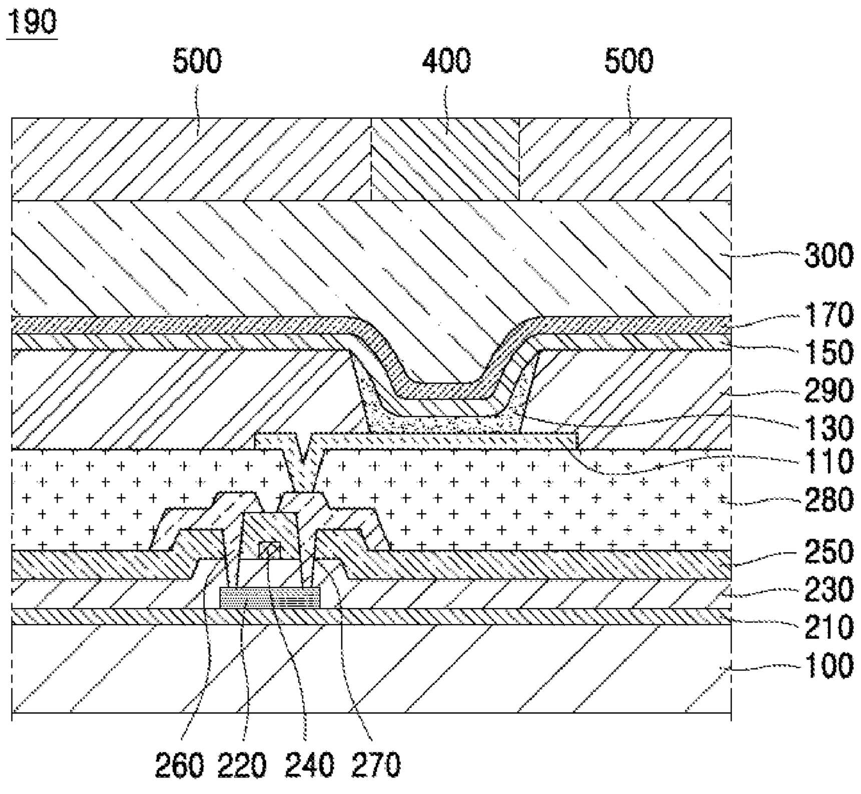
FIG. 3 is a schematic cross-sectional view of an electronic apparatus according to an embodiment.

Description of FIGS. 2 and 3

FIG. 2 is a schematic cross-sectional view of an electronic apparatus 180 according to an embodiment.

The electronic apparatus 180 of FIG. 2 includes a substrate 100, a TFT, a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may respectively contact the exposed portions of the source region and the drain region of the activation layer 220.

The TFT may be electrically connected to a light-emitting device to drive the light-emitting device, and may be covered by a passivation layer 280. The passivation layer 280 may include an inorganic insulating film, an organic insulating film, or any combination thereof. A light-emitting device may be provided on the passivation layer 280. The light-emitting device may include a first electrode 110, an interlayer 130, and a second electrode 150.

The first electrode 110 may be located on the passivation layer 280. The passivation layer 280 does not completely cover the drain electrode 270 and exposes a portion of the drain electrode 270, and the first electrode 110 may be connected to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide or a polyacrylic organic film. Although not shown in FIG. 2, at least some layers of the interlayer 130 may extend beyond the upper portion of the pixel-defining layer 290 to be provided in the form of a common layer.

The second electrode 150 may be located on the interlayer 130, and a capping layer 170 may be further included on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or a combination thereof; or a combination of the inorganic film and the organic film.

FIG. 3 is a schematic cross-sectional view of an electronic apparatus 190 according to an embodiment.

The electronic apparatus 190 of FIG. 3 may differ from the electronic apparatus 180 of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus 190 of FIG. 3 may be a tandem light-emitting device.

Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec, depending on a material to be included in a layer to be formed and the structure of a layer to be formed.

When layers constituting the hole transport region, an emission layer, and layers constituting the electron transport region are formed by spin coating, the spin coating may be performed at a coating speed in a range of about 2,000 rpm to about 5,000 rpm and at a heat treatment temperature in a range of about 80° C. to about 200° C. by taking into account a material to be included in a layer to be formed and a structure of a layer to be formed.

The quantum dot ink composition according to an embodiment may be used in a solution process, such as spin coating or inkjet printing.

Definitions of Terms

The term "$C_3$-$C_{60}$ carbocyclic group" as used herein may be a cyclic group consisting of carbon only as ring-forming atoms and having three to sixty carbon atoms, and the term "$C_1$-$C_{60}$ heterocyclic group" as used herein may be a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group may have 3 to 61 ring-forming atoms.

The term "cyclic group" as utilized herein may include the $C_3$-$C_{60}$ carbocyclic group and the $C_1$-$C_{60}$ heterocyclic group.

The term "π electron-rich $C_3$-$C_{60}$ cyclic group" as used herein may be a cyclic group that has three to sixty carbon atoms and does not include *—N═*' as a ring-forming moiety, and the term "π electron-deficient nitrogen-containing $C_1$-$C_{60}$ cyclic group" as used herein may be a heterocyclic group that has one to sixty carbon atoms and includes *—N═*' as a ring-forming moiety.

In an embodiment, the $C_3$-$C_{60}$ carbocyclic group may be a T1 group or a cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a cyclic group in which two or more T2 groups are condensed with each other, or a cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a cyclic group in which two or more T1 groups are condensed with each other, a T3 group, a cyclic group in which two or more T3 groups are condensed with each other, or a cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), and the π electron-deficient nitrogen-containing $C_1$-$C_{60}$ cyclic group may be a T4 group, a cyclic group in which two or more T4 groups are condensed with each other, a cyclic group in which at least one T4 group and at least one T1 group are condensed with each other, a cyclic group in which at least one T4 group and at least one T3 group are condensed with each other, or a cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "T1 electron-rich $C_3$-$C_{60}$ cyclic group", or "T1 electron-deficient nitrogen-containing $C_1$-$C_{60}$ cyclic group" as used herein may each be a group condensed to any cyclic group or a polyvalent group (for example, a divalent group, a trivalent group, a tetravalent group, etc.), depending on the structure of a formula in connection with which the terms may be used. In an embodiment, the "benzene group" may be a benzo group, a phenyl group, a phenylene group, or the like, which may be readily understood by one of ordinary skill in the art according to the structure of a formula including the "benzene group."

Examples of a monovalent $C_3$-$C_{60}$ carbocyclic group and a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of a divalent $C_3$-$C_{60}$ carbocyclic group and a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at the terminus of the $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at the terminus of the $C_2$-$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —$O(A_{101})$ (wherein $A_{101}$ may be the $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" used herein may be a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system having six to sixty carbon atoms, and the term "$C_6$-$C_{60}$ arylene group" as used herein may be a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein may be a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as a monovalent non-aromatic condensed polycyclic group.

The term "monovalent non-aromatic condensed heteropolycyclic group" as used herein may be a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as a monovalent non-aromatic condensed heteropolycyclic group.

The term "$C_6$-$C_{60}$ aryloxy group" as used herein may be a group represented by $-O(A_{102})$ (where $A_{102}$ may be a $C_6$-$C_{60}$ aryl group). The term "$C_6$-$C_{60}$ arylthio group" as used herein may be a group represented by $-S(A_{103})$ (where $A_{103}$ may be a $C_6$-$C_{60}$ aryl group).

The term "$C_7$-$C_{60}$ aryl alkyl group" as used herein may be a group represented by $-(A_{104})(A_{106})$ (where $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by $-(A_{106})(A_{107})$ (where $A_{106}$ may be a $C_1$-$C_{60}$ alkylene group, and $A_{107}$ may be a $C_1$-$C_6$ heteroaryl group).

The group "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $-Si(Q_{11})(Q_{12})(Q_{13})$, $-N(Q_{11})(Q_{12})$, $-B(Q_{11})(Q_{12})$, $-C(=O)(Q_{11})$, $-S(=O)_2(Q_{11})$, $-P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $-Si(Q_{21})(Q_{22})(Q_{23})$, $-N(Q_{21})(Q_{22})$, $-B(Q_{21})(Q_{22})$, $-C(=O)(Q_{21})$, $-S(=O)_2(Q_{21})$, $-P(=O)(Q_{21})(Q_{22})$, or any combination thereof; or $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, or $-P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom or a hydrogen atom. Examples of the heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the terms "ter-Bu" or "But" as used herein each refer to a tert-butyl group, and the term "OMe" as used herein refers to a methoxy group.

The term "biphenyl group" as used herein may be "a phenyl group substituted with a phenyl group." For example, the "biphenyl group" may be a substituted phenyl group having a $C_6$-$C_{60}$ aryl group as a substituent.

The term "terphenyl group" as used herein may be "a phenyl group substituted with a biphenyl group". The "terphenyl group" may be a substituted phenyl group having, as a substituent, a $C_6$-$C_{60}$ aryl group substituted with a $C_6$-$C_{60}$ aryl group.

The maximum number of carbon atoms in this substituent definition section is an example only. For example, the maximum carbon number of 60 in the $C_1$-$C_{60}$ alkyl group is an example, and the definition of the alkyl group equally applies to a $C_1$-$C_{20}$ alkyl group. The same may also to other cases.

The symbols * and *' as used herein, unless defined otherwise, each refer to a binding site to a neighboring atom in a corresponding formula.

Hereinafter, a compound and light-emitting device according to an embodiment will be described in detail with reference to the following Examples.

EXAMPLES dD, dP, dH, $R_1$, $R_2$, and $R_3$ Values and Molar Volumes of Solvents For solvents in Table 1, dD($MPa^{0.5}$), dP($MPa^{0.5}$), and dH($MPa^{0.5}$) values were calculated with a HSPiP program, and $R_1$, $R_2$, $R_3$ values were calculated using the above-described equations. The molar volumes were calculated from the density and molecular weight of the solvents.

TABLE 1

| | Name | dD | dP | dH | $R_1$ | $R_2$ | $R_3$ | Vm ($cm^3$/mol) |
|---|---|---|---|---|---|---|---|---|
| Compound 1-1 | 1-methoxy-2-[2-[2-[2-(2-methoxyethoxy)ethoxy]ethoxy]ethoxy]ethane | 16.0 | 5.6 | 7.1 | 8.1 | 8.3 | 6.4 | 260 |
| Compound 1-2 | 1,3-bis[(2-methylpropan-2-yl)oxy]propan-2-ol | 15.2 | 5.1 | 12.2 | 10.1 | 12.5 | 10.6 | 230 |
| Compound 1-3 | 2-butyldecan-1-ol | 16.1 | 2.8 | 9.4 | 9.1 | 8.7 | 7.3 | 260 |
| Compound 1-4 | 2-[2-[2-(2-butoxyethoxy)ethoxy]ethoxy]ethanol | 16.1 | 6.0 | 8.1 | 7.6 | 9.2 | 7.4 | 249 |
| Compound 1-5 | Dipropyl benzene-1,2-dicarboxylate | 17.4 | 7.3 | 3.3 | 7.4 | 7.5 | 7.0 | 233 |
| Compound 2-1 | 2-ethoxy-2-methylbutane | 14.7 | 3.0 | 2.5 | 13.1 | 5.9 | 2.2 | 153 |
| Compound 2-2 | 2-propan-2-yloxypropane | 14.7 | 3.3 | 2.7 | 12.9 | 6.1 | 2.4 | 142 |
| Compound 2-3 | 1,1,1,3,3-pentafluorobutane | 14.1 | 2.5 | 2.1 | 14.4 | 6.7 | 3.0 | 118 |
| Compound 2-4 | Tert-butyl acetate | 15.1 | 4.0 | 5.1 | 10.9 | 6.8 | 3.8 | 135 |
| Compound 2-5 | 2,4-dimethylpentan-3-one | 15.4 | 4.9 | 2.8 | 11.2 | 6.2 | 3.4 | 143 |
| Compound 3-1 | Methyl 2-hydroxybenzoate | 18.7 | 8.7 | 10.2 | 2.4 | 12.7 | 12.5 | 129 |
| Compound 3-2 | Heptylbenzene | 17.0 | 1.8 | 2.3 | 10.8 | 2.0 | 3.0 | 205 |
| Compound 3-3 | Cyclohexylbenzene | 17.8 | 1.5 | 2.7 | 10.1 | 2.3 | 4.6 | 171 |
| Compound 3-4 | 3-methylbutyl acetate | 15.7 | 4.1 | 5.3 | 9.8 | 6.3 | 4.0 | 150 |
| Compound 3-5 | Ethyl butanoate | 15.7 | 4.7 | 5.8 | 9.4 | 7.0 | 4.8 | 133 |

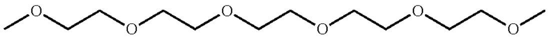

1-1

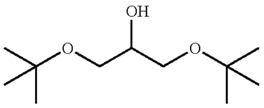

1-2

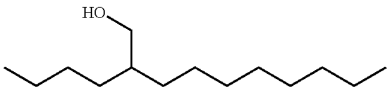

1-3

TABLE 1-continued

| Name | dD | dP | dH | $R_1$ | $R_2$ | $R_3$ | Vm ($cm^3$/mol) |
|---|---|---|---|---|---|---|---|
| 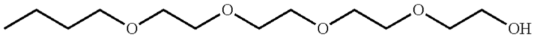 [SMILES: CCCCOCCOCCOCCOCCO] 1-4 | | | | | | | |
| 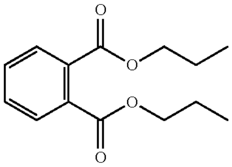 [SMILES: CCCOC(=O)c1ccccc1C(=O)OCCC] 1-5 | | | | | | | |
| 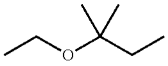 2-1 | | | | | | | |
| 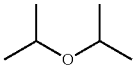 2-2 | | | | | | | |
| 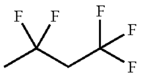 2-3 | | | | | | | |
| 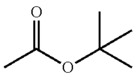 2-4 | | | | | | | |
| 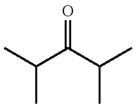 2-5 | | | | | | | |
| 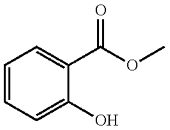 3-1 | | | | | | | |
| 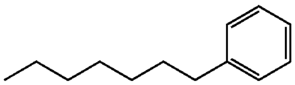 3-2 | | | | | | | |
| 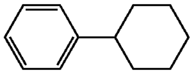 [SMILES: c1ccc(C2CCCCC2)cc1] 3-3 | | | | | | | |
| 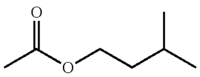 3-4 | | | | | | | |
| 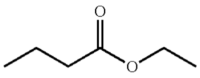 3-5 | | | | | | | |

Preparation of Mixed Solvent for Quantum Dot Ink Composition

Mixed solvents for quantum dot ink compositions were prepared with the solvent composition of Table 2, and $R_1$ and $R_2$ values and a molar volume ($cm^3$/mol) were calculated for each solvent system. In the case of two or more solvent systems, the $R_1$ value and the $R_2$ value of the mixed solvent may each be calculated by adding values obtained by multiplying dD, dP, and dH of each of the at least two solvents respectively by wt % ratio of the at least two solvents, and the molar volume of the mixed solvent may be calculated by adding values obtained by multiplying a molar volume of each of the at least two solvents respectively by the wt % ratio of the at least two solvents.

TABLE 2

| | Solvent composition | $R_1$ | $R_2$ | Molar volume |
|---|---|---|---|---|
| Example 1 | Compound 1-1 (98 wt %) + Compound 2-2 (2 wt %) | 8.2 | 8.2 | 258 |
| Example 2 | Compound 1-2 (95 wt %) + Compound 2-2 (5 wt %) | 10.0 | 12.0 | 225 |
| Example 3 | Compound 1-3 (98 wt %) + Compound 2-2 (2 wt %) | 9.2 | 8.6 | 258 |

TABLE 2-continued

| | Solvent composition | $R_1$ | $R_2$ | Molar volume |
|---|---|---|---|---|
| Example 4 | Compound 1-4 (98 wt %) + Compound 2-2 (2 wt %) | 7.7 | 9.1 | 247 |
| Example 5 | Compound 1-5 (98 wt %) + Compound 2-2 (2 wt %) | 7.5 | 7.4 | 231 |
| Example 6 | Compound 1-3 (98 wt %) + Compound 2-1 (2 wt %) | 9.2 | 8.6 | 258 |
| Example 7 | Compound 1-3 (98 wt %) + Compound 2-3 (2 wt %) | 9.2 | 8.6 | 257 |
| Example 8 | Compound 1-3 (95 wt %) + Compound 2-4 (5 wt %) | 9.2 | 8.5 | 254 |
| Example 9 | Compound 1-3 (95 wt %) + Compound 2-5 (5 wt %) | 9.1 | 8.4 | 254 |
| Comparative Example 1 | Compound 1-1 (100 wt %) | 8.1 | 8.3 | 260 |
| Comparative Example 2 | Compound 1-2 (100 wt %) | 10.1 | 12.5 | 230 |
| Comparative Example 3 | Compound 1-3 (100 wt %) | 9.1 | 8.7 | 260 |
| Comparative Example 4 | Compound 1-4 (100 wt %) | 7.6 | 9.2 | 249 |
| Comparative Example 5 | Compound 1-5 (100 wt %) | 7.4 | 7.5 | 233 |
| Comparative Example 6 | Compound 2-1 (100 wt %) | 13.1 | 5.9 | 153 |
| Comparative Example 7 | Compound 1-1 (85 wt %) + Compound 2-1 (15 wt %) | 8.6 | 7.9 | 249 |
| Comparative Example 8 | Compound 3-1 (98 wt %) + Compound 2-1 (2 wt %) | 2.4 | 12.4 | 129 |
| Comparative Example 9 | Compound 3-2 (98 wt %) + Compound 2-1 (2 wt %) | 10.9 | 2.1 | 205 |
| Comparative Example 10 | Compound 3-3 (100 wt %) | 10.1 | 2.3 | 171 |
| Comparative Example 11 | Compound 3-4 (100 wt %) | 9.8 | 6.3 | 150 |
| Comparative Example 12 | Compound 3-5 (100 wt %) | 9.4 | 7.0 | 133 |

Preparation of Quantum Dot Ink Composition

After a quantum dot ink composition (3 wt % of quantum dots) was prepared with the composition of Table 3, swelling of parts during a coating process by inkjet printing was checked. The dispersion of quantum dots was checked by considering whether sedimentation occurred after leaving the prepared quantum dot ink composition at room temperature for one week.

TABLE 3

| | Quantum dot (10 nm)-blue | Solvent composition | Swelling of part 1 | Swelling of part 2 | Dispersion of quantum dots |
|---|---|---|---|---|---|
| Example 10 | InP core and ZnSe/ZnS shell | Compound 1-1 (98 wt %) + Compound 2-2 (2 wt %) | X | X | ○ |
| Example 11 | InP core and ZnSe/ZnS shell | Compound 1-2 (95 wt %) + Compound 2-2 (5 wt %) | X | X | ○ |
| Example 12 | InP core and ZnSe/ZnS shell | Compound 1-3 (98 wt %) + Compound 2-2 (2 wt %) | X | X | ○ |
| Example 13 | InP core and ZnSe/ZnS shell | Compound 1-4 (98 wt %) + Compound 2-2 (2 wt %) | X | X | ○ |
| Example 14 | InP core and ZnSe/ZnS shell | Compound 1-5 (98 wt %) + Compound 2-2 (2 wt %) | X | X | ○ |
| Example 15 | InP core and ZnSe/ZnS shell | Compound 1-3 (98 wt %) + Compound 2-1 (2 wt %) | X | X | ○ |
| Example 16 | InP core and ZnSe/ZnS shell | Compound 1-3 (98 wt %) + Compound 2-3 (2 wt %) | X | X | ○ |
| Example 17 | InP core and ZnSe/ZnS shell | Compound 1-3 (95 wt %) + Compound 2-4 (5 wt %) | X | X | ○ |
| Example 18 | InP core and ZnSe/ZnS shell | Compound 1-3 (95 wt %) + Compound 2-5 (5 wt %) | X | X | ○ |
| Comparative Example 13 | InP core and ZnSe/ZnS shell | Compound 1-1 (100 wt %) | X | X | X |
| Comparative Example 14 | InP core and ZnSe/ZnS shell | Compound 1-2 (100 wt %) | X | X | X |
| Comparative Example 15 | InP core and ZnSe/ZnS shell | Compound 1-3 (100 wt %) | X | X | X |
| Comparative Example 16 | InP core and ZnSe/ZnS shell | Compound 1-4 (100 wt %) | X | X | X |
| Comparative Example 17 | InP core and ZnSe/ZnS shell | Compound 1-5 (100 wt %) | X | X | X |
| Comparative Example 18 | InP core and ZnSe/ZnS shell | Compound 2-1 (100 wt %) | X | ○ | ○ |
| Comparative Example 19 | InP core and ZnSe/ZnS shell | Compound 1-1 (85 wt %) + Compound 2-1 (15 wt %) | X | ○ | ○ |
| Comparative Example 20 | InP core and ZnSe/ZnS shell | Compound 3-1 (98 wt %) + Compound 2-1 (2 wt %) | ○ | X | ○ |
| Comparative Example 21 | InP core and ZnSe/ZnS shell | Compound 3-2 (98 wt %) + Compound 2-1 (2 wt %) | X | ○ | ○ |
| Comparative Example 22 | InP core and ZnSe/ZnS shell | Compound 3-3 (100 wt %) | X | ○ | ○ |
| Comparative Example 23 | InP core and ZnSe/ZnS shell | Compound 3-4 (100 wt %) | X | ○ | ○ |
| Comparative Example 24 | InP core and ZnSe/ZnS shell | Compound 3-5 (100 wt %) | ○ | ○ | ○ |

In Table 3, part 1 was a portion treated with an adhesive and polymer coating in an inkjet head, and part 2 was an equipment roller unit part.

Each of the viscosities of the Comparative Examples and Examples was about 5 cP, and each of the surface tensions thereof was about 28 dyne/cm. Each of the vapor pressures of the Comparative Examples and Examples was $10^{-3}$ mmHg to $9\times10^{-3}$ mmHg.

Manufacture of Electronic Apparatus

Example 19

As shown in FIG. 3, the emission layer in the interlayer 130 was formed by inkjet using the quantum dot ink composition of Example 10 of Table 3 to manufacture 1,000 electronic apparatuses.

Comparative Example 25

1,000 electronic apparatuses were manufactured in the same manner as in Example 10, except that the quantum dot ink composition of Comparative Example 19 of Table 3 was used for the emission layer.

In the case of Example 19, 1,000 electronic apparatuses were readily manufactured, whereas in the case of Comparative Example 25, there were difficulties in manufacturing electronic apparatuses because swelling of parts resulted in replacement of the parts, making the inkjet process not smooth.

A quantum dot ink composition according to an embodiment may have no damage to inkjet equipment, and a light-emitting device including an emission layer prepared using the quantum dot ink composition may have excellent efficiency.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A mixed solvent for a quantum dot ink composition, the mixed solvent comprising:

at least two solvents, wherein an $R_1$ value of the mixed solvent is greater than or equal to about 7.3 $Mpa^{0.5}$, an $R_2$ value of the mixed solvent is greater than or equal to about 5.0 $Mpa^{0.5}$, a molar volume of the mixed solvent is greater than or equal to about 160 $cm^3$/mol, the mixed solvent comprises a first solvent and a solvent Z, an amount of the first solvent is greater than about 97 wt % and less than or equal to about 99 wt % based on 100 wt % of the mixed solvent, an amount of the solvent Z is greater than about 1 wt % and less than or equal to about 7 wt % based on 100 wt % of the mixed solvent, $$R_1^2 = 4(dD - 19.7)^2 + (dP - 8.4)^2(dH - 9.0)^2,$$

$$R_2^2 = 4(dD - 17.2)^2 + dP^2 + (dH - 1.5)^2,$$

dD indicates a dispersion component of Hansen parameters for each of the at least two solvents, dP indicates a polar component of the Hansen parameters for each of the at least two solvents, dH indicates a hydrogen-bonding component of the Hansen parameters for each of the at least two solvents, wherein, for the mixed solvent, the dD, dP, and dH used in the foregoing $R_1^2$ and $R_2^2$ expressions are mixture-averaged Hansen parameters computed as wt %-weighted sums of the component solvents' respective parameters, and wherein $R_1$ and $R_2$ are the principal square roots of the foregoing $R_1^2$ and $R_2^2$ expressions, the $R_1$ value and the $R_2$ value of the mixed solvent are each calculated by adding values obtained by multiplying dD, dP, and dH of each of the at least two solvents respectively by wt % ratio of the at least two solvents, and the molar volume of the mixed solvent is calculated by adding values obtained by multiplying a molar volume of each of the at least two solvents respectively by the wt % ratio of the at least two solvents, wherein $Mpa^{0.5}$ is a unit of the Hansen parameters.

2. The mixed solvent of claim 1, wherein the mixed solvent comprises a solvent Z, an $R_3$ value of the solvent Z is less than or equal to about 6.8 $Mpa^{0.5}$, a molar volume of the solvent Z is less than or equal to about 160 $cm^3$/mol, $$R_3^2 = 4(dD - 15.5)^2 + (dP - 1.5)^2 + (dH - 2.3)^2,$$

dD indicates a dispersion component of Hansen parameters for the solvent Z, dP indicates a polar component of the Hansen parameters for the solvent Z, and dH indicates a hydrogen-bonding component of the Hansen parameters for the solvent Z.

3. The mixed solvent of claim 1, wherein an amount of the solvent Z is greater than 1 wt % and less than or equal to about 5 wt %, based on 100 wt % of the mixed solvent.

4. The mixed solvent of claim 3, wherein the first solvent comprises an alcohol moiety, an ether moiety, or an ester moiety.

5. The mixed solvent of claim 3, wherein the solvent Z comprises a linear or branched $C_1$-$C_{10}$ saturated hydrocarbon moiety, an ether moiety, an ester moiety, a halogen moiety, or a ketone moiety.

6. The mixed solvent of claim 1, wherein the mixed solvent comprises at least one of 1-methoxy-2-[2-[2-[2-(2-methoxyethoxy)ethoxy]ethoxy]ethoxy]ethane, 1,3-bis[(2-methylpropan-2-yl)oxy]propan-2-ol, 2-butyldecan-1-ol, 2-[2-[2-(2-butoxyethoxy)ethoxy]ethoxy]ethanol, dipropyl benzene-1,2,-dicarboxylate, 2-ethoxy-2-methylbutane, 2-propan-2-yloxypropane, 1,1,1,3,3-pentafluorobutane, tert-butyl acetate, or 2,4-dimethylpentan-3-one.

7. The mixed solvent of claim 1, wherein the mixed solvent does not comprise:

a solvent having an $R_1$ value of less than or equal to about 7.3 $Mpa^{0.5}$ and the molar volume of less than or equal to about 160 $cm^3$/mol, or a solvent having an $R_2$ value of less than or equal to about 5.0 $Mpa^{0.5}$ and the molar volume of less than or equal to about 160 $cm^3$/mol.

8. A quantum dot ink composition comprising:

a quantum dot; and the mixed solvent for the quantum dot ink composition of claim 1.

9. The quantum dot ink composition of claim 8, wherein the quantum dot has a core-shell structure, and the quantum dot comprises:

a core including a semiconductor compound; and a shell comprising a metal oxide, a metalloid oxide, a non-metal oxide, a semiconductor compound, or a combination thereof.

10. The quantum dot ink composition of claim 9, wherein the semiconductor compound comprises a Group II-VI semiconductor compound, a Group III-V semiconductor compound, a Group III-VI semiconductor compound, a Group I-III-VI semiconductor compound, a Group IV-VI semiconductor compound, a Group IV element or compound, or a combination thereof, and the metal oxide, the metalloid oxide, or the non-metal oxide comprises $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, $MgAl_2O_4$, $CoFe_2O_4$, $NiFe_2O_4$, $CoMn_2O_4$, or a combination thereof.

11. The quantum dot ink composition of claim 9, wherein the semiconductor compound comprises CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, InGaZnP, InAlZnP, GaS, GaSe, $GazSe_3$, GaTe, InS, InSe, $In_2S_3$, $In_2Se_3$, InTe, $InGaS_3$, $InGaSe_3$, AgInS, $AgInS_2$, CuInS, $CuInS_2$, $CuGaO_2$, $AgGaO_2$, $AgAlO_2$, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, Si, Ge, SiC, SiGe, or a combination thereof.

12. The quantum dot ink composition of claim 9, wherein the semiconductor compound comprises CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof.

13. The quantum dot ink composition of claim 8, wherein a viscosity (at 25° C.) of the composition is in a range of about 2 cP to about 10 cP.

14. The quantum dot ink composition of claim 8, wherein a surface tension of the composition is in a range of about 20 dyne/cm to about 40 dyne/cm.

15. The quantum dot ink composition of claim 8, wherein a vapor pressure of the composition is less than or equal to about $10^{-2}$ mmHg.

16. A light-emitting device comprising:

a first electrode;

a second electrode facing the first electrode; and an interlayer between the first electrode and the second electrode and comprising an emission layer, wherein the emission layer is prepared using the quantum dot ink composition of claim 8.

17. The light-emitting device of claim 16, wherein the interlayer further comprises a hole transport region comprising:

a hole injection layer, a hole transport layer, an emission auxiliary layer, an electron blocking layer, or a combination thereof.

18. The light-emitting device of claim 16, wherein the interlayer further comprises an electron transport region comprising:

a hole blocking layer, an electron transport layer, an electron injection layer, or a combination thereof.

19. An electronic apparatus comprising the light-emitting device of claim 16.

* * * * *